United States Patent [19]
Fujimoto et al.

[11] Patent Number: 5,905,409
[45] Date of Patent: May 18, 1999

[54] MICROWAVE AND MILLIMETER WAVE CIRCUIT INCLUDING AMPLIFIER AND BAND ELIMINATION FILTERS

[75] Inventors: Shinichi Fujimoto; Takuo Kashiwa, both of Tokyo, Japan

[73] Assignee: Mitsubishi Denki Kabushiki Kaisha, Tokyo, Japan

[21] Appl. No.: 08/943,929

[22] Filed: Oct. 3, 1997

[30] Foreign Application Priority Data

Mar. 13, 1997 [JP] Japan .................................... 9-059405

[51] Int. Cl.⁶ ...................................................... H03F 3/191
[52] U.S. Cl. ............................................ 330/302; 330/306
[58] Field of Search .................................. 330/302, 303, 330/306, 277, 286

[56] References Cited

U.S. PATENT DOCUMENTS

| 5,146,178 | 9/1992 | Nojima et al. | 330/306 |
| 5,406,224 | 4/1995 | Mikami et al. | 330/277 |
| 5,412,347 | 5/1995 | Minnis | 330/286 |

FOREIGN PATENT DOCUMENTS 08274552  10/1996  Japan .

*Primary Examiner*—Robert Pascal
*Assistant Examiner*—Patricia Nguyen
*Attorney, Agent, or Firm*—Leydig, Voit & Mayer

[57] ABSTRACT

A microwave and millimeter wave circuit includes an amplifier having an amplification center frequency, input and output terminals, and a source-grounded transistor. First and second transmission lines are connected between the input terminal and a gate of the transistor, and are connected in series to each other. Third and fourth transmission lines are connected between a drain of the transistor and the output terminal, and are connected in series to each other. A first band elimination filter is connected to the input terminal, and has a first stopping frequency, and a second band elmination filter is connected to the output terminal, and has a second stopping frequency. A third band elimination filter is connected to a connecting point between the first and second transmission lines and has a third stopping frequency, and a fourth band elimination filter is connected to a connecting point between the third and fourth transmission lines and has a fourth stopping frequency. Each of the first to fourth stopping frequencies is lower than the amplification center frequency, and each of the third and fourth stopping frequencies is higher than the first and second stopping frequencies.

14 Claims, 18 Drawing Sheets

MICROWAVE AND MILLIMETER WAVE CIRCUIT INCLUDING AMPLIFIER AND BAND ELIMINATION FILTERS

BACKGROUND OF THE INVENTION

1. Field of the Invention

The present invention relates to a microwave and millimeter wave circuit including an amplifier and band elimination filters, and in particular, to a microwave and millimeter wave circuit for use in integrated circuits (referred to as ICs hereinafter) for microwaves, quasi-millimeter waves and millimeter waves at frequencies of about 800 MHz to about 300 GHz.

2. Description of the Prior Art

FIG. 13 is a circuit diagram of a microwave and millimeter wave amplifier circuit of a first prior art.

Referring to FIG. 13, in an amplifier circuit, a gate and a drain of a field effect transistor (referred to as an FET hereinafter) Q having a source grounded (referred to as a source-grounded FET hereinafter) are inserted between an input terminal 1 and an output terminal 2, and between two microstrip lines T11 and T12, each of which is a transmission line. In this amplifier circuit, a band elimination filter (referred to as a BEF hereinafter) FE comprising a series circuit of a microstrip line T13 of a transmission line functioning as an inductor, and a capacitor C11, and having a stopping frequency $f_c$ lower than a desired amplification center frequency $f_0$ of the amplifier circuit is connected to the drain of the FET Q. This amplifier circuit has a gain frequency characteristic as shown by a gain G10 in FIG. 17. In this case, the amplifier circuit has had such a problem in that there is unnecessary gain, as shown by G11, at lower frequencies near the stopping frequency $f_c$.

In order to solve this problem, as shown in FIG. 14 showing a second prior art, a directional coupler comprising two ¼ wavelength microstrip lines T21 and T22 which are opposed to each other and electromagnetically coupled with each other is provided instead of the microstrip line T12, by which the improper gain G11 is eliminated as shown by a gain G12 of FIG. 17.

FIG. 15 is a circuit diagram of a microwave and millimeter wave amplifier circuit of a third prior art as disclosed in the Japanese Patent Laid-Open Publication No. 8-274552.

Referring to FIG. 15, reference numeral 1 denotes an input terminal, 2 denotes an output terminal, 3 and 4 denote bias applying terminals, reference character Q denotes an FET, T11 to T16 denote microstrip lines, which are transmission lines functioning as inductors, C11 and C12 denote capacitors, Rg denotes a resistor, and Ls1 and Ls2 denote high-frequency stopping inductors. A frequency characteristic of the microwave and millimeter wave amplifier circuit constructed as described above has an unnecessary gain arising at about 2 GHz or lower, as shown in FIG. 18, in a manner similar to that of the first prior art. Also, the stabilizing factor K of the circuit is lower than at frequencies of about 13 GHz to 27 GHz, so that the operation of the circuit is unstable.

Further, FIG. 16 is a circuit diagram of a microwave and millimeter wave amplifier circuit of a fourth prior art as disclosed in the U.S. Pat. No. 5,412,347.

Referring to FIG. 16, reference numeral 1 denotes an input terminal, 2 denotes an output terminal, 3 and 4 denote bias applying terminals, reference character Q denotes an FET, T11 to T17 denote microstrip lines, which are transmission lines functioning as inductors, C11 to C15 denote capacitors, and R11 denotes a resistor.

The microwave and millimeter wave amplifier circuit of the second prior art indeed has solved the problem of the first prior art. However, since the microwave and millimeter wave amplifier circuit comprises the directional coupler, the ¼ wavelength line at 60 GHz, for example, has a length beyond 400 μm. Therefore, the directional coupler is relatively large, and this results in the problem that the circuit including the amplifier circuit can not be miniaturized.

In order to solve the problem of the third prior art, the stabilizing factor K can be made to be equal to or more than one, for example, by adding a microstrip line functioning as a relatively long inductor to the source of the FET Q as shown in FIG. 19. However, there still exists an unnecessary gain. Inserting the inductor, which is a feedback circuit, causes the amplification gain of the amplifier circuit to lower from about 18 dB to about 6 dB with a decrement as much as about 12 dB. Besides, the fourth prior art also has a problem similar to that of the third prior art, so that a larger gain can not be obtained in wider band.

SUMMARY OF THE INVENTION

An essential object of the present invention is to provide a microwave and millimeter wave circuit including an amplifier and band elimination filters, capable of obtaining a larger gain in a wider band.

Another object of the present invention is to provide a microwave and millimeter wave circuit including an amplifier and band elimination filter, capable of being miniaturized as compared with those of the prior arts.

In order to achieve the aforementioned objective, according to one aspect of the present invention, there is provided a microwave and millimeter wave circuit comprising an amplifier having a predetermined amplification center frequency provided between an input terminal and an output terminal of said microwave and millimeter wave circuit, said amplifier comprising a source-grounded transistor having a gate, a drain and a source, said microwave and millimeter wave circuit comprising:

first and second transmission lines connected between said input terminal and the gate of said transistor, and connected in series to each other, said first and second transmission lines each functioning as an inductor;

third and fourth transmission lines connected between the drain of said transistor and said output terminal, and connected in series to each other, said third and fourth transmission lines each functioning as an inductor;

a first band elimination filter connected to said input terminal, said first band elimination filter comprising at least a first capacitor, and having a first stopping frequency;

a second band elimination filter connected to said output terminal, said second band elimination filter comprising at least a second capacitor, and having a second stopping frequency;

a third band elimination filter comprising a first parallel circuit composed of a third capacitor and a first series circuit of a fourth capacitor and a first resistor, and comprising a second series circuit of said first parallel circuit and a fifth transmission line functioning as an inductor, said third band elimination filter being connected to a connecting point between the first and second transmission lines and having a third stopping frequency; and a fourth band elimination filter comprising a third parallel circuit composed of a fifth capacitor and a third series circuit of a sixth capacitor and a second resistor, and comprising a fourth series circuit of said third parallel circuit and a sixth transmission line functioning as an inductor, said fourth band elimination filter being connected to a connecting point between said third and fourth transmission lines and having a fourth stopping frequency, wherein each of the first and second stopping frequencies and the third and fourth stopping frequencies is set to be lower than the amplification center frequency, and each of the third and fourth stopping frequencies is set to be higher than the first and second stopping frequencies.

In the above-mentioned microwave and millimeter wave circuit, said first band elimination filter preferably further comprises a seventh transmission line connected in series to said first capacitor, said seventh transmission line functioning as an inductor, and wherein said second band elimination filter preferably further comprises an eighth transmission line connected in series to said second capacitor, said eighth transmission line functioning as an inductor.

According to another aspect of the present invention, there is provided a microwave and millimeter wave circuit comprising an amplifier having a predetermined amplification center frequency provided between an input terminal and an output terminal of said microwave and millimeter wave circuit, said amplifier comprising a source-grounded transistor having a gate, a drain and a source, said microwave and millimeter wave circuit comprising:

first and second transmission lines connected between said input terminal and the gate of said transistor and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to said input terminal, said first band elimination filter comprising at least a first capacitor, and having a first stopping frequency;

a second band elimination filter comprising a first parallel circuit composed of a second capacitor and a first series circuit of a third capacitor and a first resistor, and comprising a second series circuit of said first parallel circuit and a fifth transmission line functioning as an inductor, said second band elimination filter being connected to a connecting point between said first and second transmission lines and having a second stopping frequency; and a third band elimination filter comprising a third parallel circuit composed of a fourth capacitor and a third series circuit of a fifth capacitor and a second resistor, and comprising a fourth series circuit of said third parallel circuit and a sixth transmission line functioning as an inductor, said third band elimination filter being connected to a connecting point between said third and fourth transmission lines and having a third stopping frequency, wherein each of the first stopping frequency and the second and third stopping frequencies is set to be lower than the amplification center frequency, and each of the second and third stopping frequencies is set to be higher than the first stopping frequency.

In the above-mentioned microwave and millimeter wave circuit, said first band elimination filter preferably further comprises a seventh transmission line connected in series to said first capacitor, said seventh transmission line functioning as an inductor.

In the above-mentioned microwave and millimeter wave circuit, the source of said transistor is preferably grounded via an eighth transmission line functioning as an inductor.

According to a further aspect of the present invention, there is provided a microwave and millimeter wave circuit comprising an amplifier having a predetermined amplification center frequency provided between an input terminal and an output terminal of said microwave and millimeter wave circuit, said amplifier comprising a source-grounded transistor having a gate, a drain and a source, said microwave and millimeter wave circuit comprising:

first and second transmission lines connected between said input terminal and the gate of said transistor and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to a connecting point between said first and second transmission lines, said first band elimination filter comprising at least a first capacitor, and having a first stopping frequency;

a second band elimination filter connected to a connecting point between said third and fourth transmission lines, said second band elimination filter comprising at least a second capacitor, and having a second stopping frequency;

a third band elimination filter comprising a first parallel circuit composed of a third capacitor and a first series circuit of a fourth capacitor and a first resistor, and comprising a second series circuit of said first parallel circuit and a fifth transmission line functioning as an inductor, said third band elimination filter being connected to said input terminal and having a third stopping frequency; and a fourth band elimination filter comprising a third parallel circuit composed of a fifth capacitor and a third series circuit of a sixth capacitor and a second resistor, and comprising a fourth series circuit of said third parallel circuit and a sixth transmission line functioning as an inductor, said fourth band elimination filter being connected to said output terminal and having a fourth stopping frequency;

wherein each of the first and second stopping frequencies and the third and fourth stopping frequencies is set to be lower than the amplification center frequency, and each of the third and fourth stopping frequencies is set to be higher than the first and second stopping frequencies.

In the above-mentioned microwave and millimeter wave circuit, said first band elimination filter preferably further comprises a seventh transmission line connected in series to said first capacitor, said seventh transmission line functioning as an inductor, and wherein said second band elimination filter preferably further comprises an eighth transmission line connected in series to said second capacitor, said eighth transmission line functioning as an inductor.

In the above-mentioned microwave and millimeter wave circuit, the source of said transistor is preferably grounded via a ninth transmission line functioning as an inductor.

According to a still further aspect of the present invention, there is provided a microwave and millimeter wave circuit comprising an amplifier having a predetermined amplification center frequency provided between an input terminal and an output terminal of said microwave and millimeter wave circuit, said amplifier comprising a source-grounded transistor having a gate, a drain and a source, said microwave and millimeter wave circuit comprising:

first and second transmission lines connected between said input terminal and the gate of said transistor and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to a connecting point between said first and second transmission lines, said first band elimination filter comprising at least a first capacitor, and having a first stopping frequency;

a second band elimination filter comprising a first parallel circuit composed of a second capacitor and a first series circuit of a third capacitor and a first resistor, and comprising a second series circuit of said first parallel circuit and a fifth transmission line functioning as an inductor, said second band elimination filter being connected to said input terminal and having a second stopping frequency; and a third band elimination filter comprising a third parallel circuit composed of a fourth capacitor and a third series circuit of a fifth capacitor and a second resistor, and comprising a fourth series circuit of said third parallel circuit and a sixth transmission line functioning as an inductor, said third band elimination filter being connected to said output terminal and having a third stopping frequency;

wherein each of the first stopping frequency and the second and third stopping frequencies is set to be lower than the amplification center frequency, and each of the second and third stopping frequencies is set to be higher than the first stopping frequency.

In the above-mentioned microwave and millimeter wave circuit, said first band elimination filter preferably further comprises a seventh transmission line connected in series to said first capacitor, said seventh transmission line functioning as an inductor.

In the above-mentioned microwave and millimeter wave circuit, the source of said transistor is preferably grounded via an eighth transmission line functioning as an inductor.

According to a still more further aspect of the present invention, there is provided a microwave and millimeter wave circuit comprising an amplifier having a predetermined amplification center frequency provided between an input terminal and an output terminal of said microwave and millimeter wave circuit, said amplifier comprising a source-grounded transistor having a gate, a drain and a source, said microwave and millimeter wave circuit comprising:

first and second transmission lines connected between said input terminal and the gate of said transistor and connected in series to each other, said first and second transmission lines each functioning as an inductor;

a third transmission line connected between the drain of said transistor and said output terminal, said third transmission line functioning as an inductor;

a first band elimination filter connected to a connecting point between said first and second transmission lines, said first band elimination filter comprising at least a first capacitor, and having a first stopping frequency;

a second band elimination filter connected to said output terminal, said second band elimination filter comprising at least a second capacitor, and having a second stopping frequency; and a third band elimination filter comprising a first parallel circuit composed of a third capacitor and a first series circuit of a fourth capacitor and a first resistor, and comprising a second series circuit of said first parallel circuit and a fourth transmission line functioning as an inductor, said third band elimination filter being connected to said input terminal and having a third stopping frequency;

wherein each of the first and second stopping frequencies and the third stopping frequency is set to be lower than the amplification center frequency, and the third stopping frequency is set higher than the first and second stopping frequencies.

In the above-mentioned microwave and millimeter wave circuit, said first band elimination filter preferably further comprises a fifth transmission line connected in series to said first capacitor, said fifth transmission line functioning as an inductor, and wherein said second band elimination filter preferably further comprises a sixth transmission line connected in series to said second capacitor, said sixth transmission line functioning as an inductor.

In the above-mentioned microwave and millimeter wave circuit, the source of said transistor is preferably grounded via a seventh transmission line functioning as an inductor.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments according to the present invention will be described below with reference to the attached drawings.

FIRST PREFERRED EMBODIMENT

Figure 1:
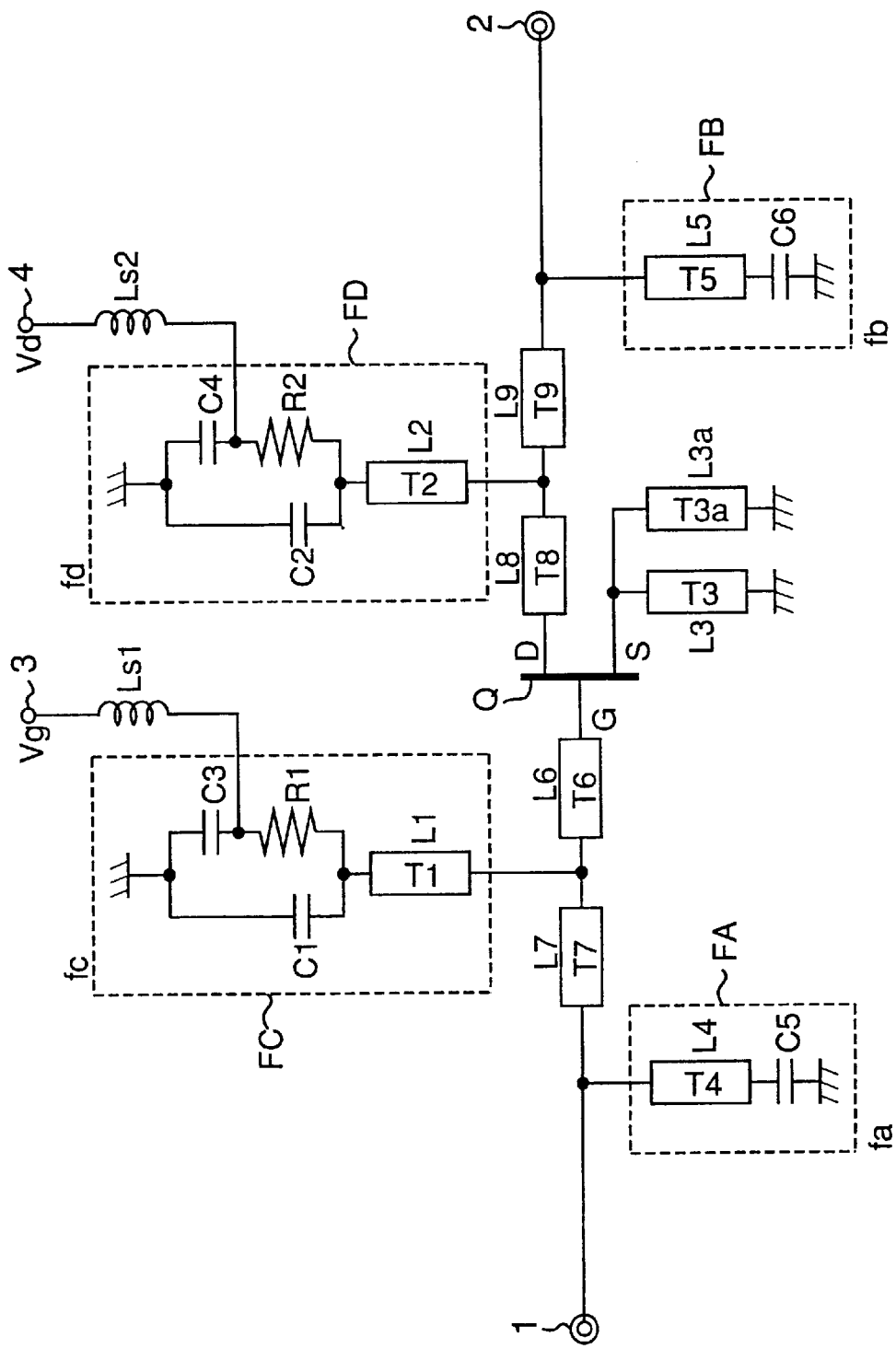
FIG. 1 is a circuit diagram of a microwave and millimeter wave amplifier circuit of a first preferred embodimen according to the present invention.

FIG. 1 is a circuit diagram of a microwave and millimeter wave amplifier circuit of a first preferred embodiment according to the present invention. This first preferred embodiment provides an amplifier circuit comprising an FET Q, a pseudo morphic HEMT (High Electron Mobility Transistor), for amplification, wherein the FET Q is connected between an input terminal 1 and an output terminal 2, and the source is grounded via a parallel circuit of two microstrip lines T3 and T3a, and, as shown in FIG. 1, (a) a BEF FA having a stopping frequency $f_a$, and (b) a BEF FC having a stopping frequency $f_c$ are connected to the gate of the FET Q, and wherein (c) a BEF FD having a stopping frequency $f_d$, and (d) a BEF FB having a stopping frequency $f_b$ are connected to the drain of the FET Q.

In this case, if the amplification center frequency of the amplifier circuit is $f_0$, then the stopping frequencies $f_a$, $f_b$, $f_c$, $f_d$ preferably satisfy the following equations:

$$f_a \approx f_b < f_c \approx f_d < f_0 \qquad (1)$$

That is, in the amplifier circuit of this preferred embodiment, the stopping frequencies $f_c$ and $f_d$ are set to frequencies lower than the amplification center frequency $f_0$ in the vicinity of $f_0$, while the stopping frequencies $f_a$ and $f_b$ are set to frequencies lower than the stopping frequencies $f_c$ and $f_d$. In other words, the BEFs FA and FB as well as the BEFs FC and FD both attenuate signals having frequencies lower than the amplification center frequency $f_0$. In this case, the BEFs FA and FB attenuate signals of lower frequencies, while the BEFs FC and FD attenuate signals of higher frequencies. In addition, the stopping frequencies $f_a$ and $f_b$ are set so as to be substantially equal to each other, and the stopping frequencies $f_c$ and $f_d$ are set so as to be substantially equal to each other.

Referring to FIG. 1, reference numeral 3 denotes a bias applying terminal to which a gate bias voltage Vg is applied, 4 denotes a bias applying terminal to which a drain bias voltage Vd is applied, T1 to T9 and T3a denote microstrip lines which are transmission lines functioning as inductors L1 to L9 and L3a, respectively, and C1 to C6 denote capacitors implemented by, for example, MIM (Metal-Insulating-Metal) capacitors or interdigited capacitors, R1 and R2 denote resistors, and Ls1 and Ls2 denote high-frequency blocking inductors. In this case, the microstrip lines T4 and T5 form short stubs.

The BEF FA comprises a series circuit of the microstrip line T4 and the capacitor C5, while the BEF FB comprises a series circuit of the microstrip line T5 and the capacitor C6. Also, the BEF FC comprises a series circuit of:

(a) a parallel circuit which includes a series circuit of the capacitor C3 and the resistor R1, and the capacitor C1; and (b) the microstrip line T1, where a connecting point between the capacitor C3 and the resistor R1 is connected to the bias applying terminal 3 via the high-frequency stopping inductor Ls1. Further, the BEF FD comprises a series circuit of:

(a) a parallel circuit which is composed of a series circuit of the capacitor C4 and the resistor R2, and the capacitor C2; and (b) the microstrip line T2, where a connecting point between the capacitor C4 and the resistor R2 is connected to the bias applying terminal 4 via the high-frequency stopping inductor Ls2.

The input terminal 1 is grounded via the BEF FA, and besides is connected to the gate of the FET Q via the microstrip lines T7 and T6, where a connecting point between the microstrip lines T7 and T6 is grounded via the BEF FC. On the other hand, the output terminal 2 is grounded via the BEF FB and besides is connected to the drain of the FET Q via the microstrip lines T9 and T8, where a connecting point between the microstrip lines T8 and T9 is grounded via the BEF FD. Further, the source of the FET Q is grounded via the parallel circuit of the two microstrip lines T3 and T3a.

Figure 21:
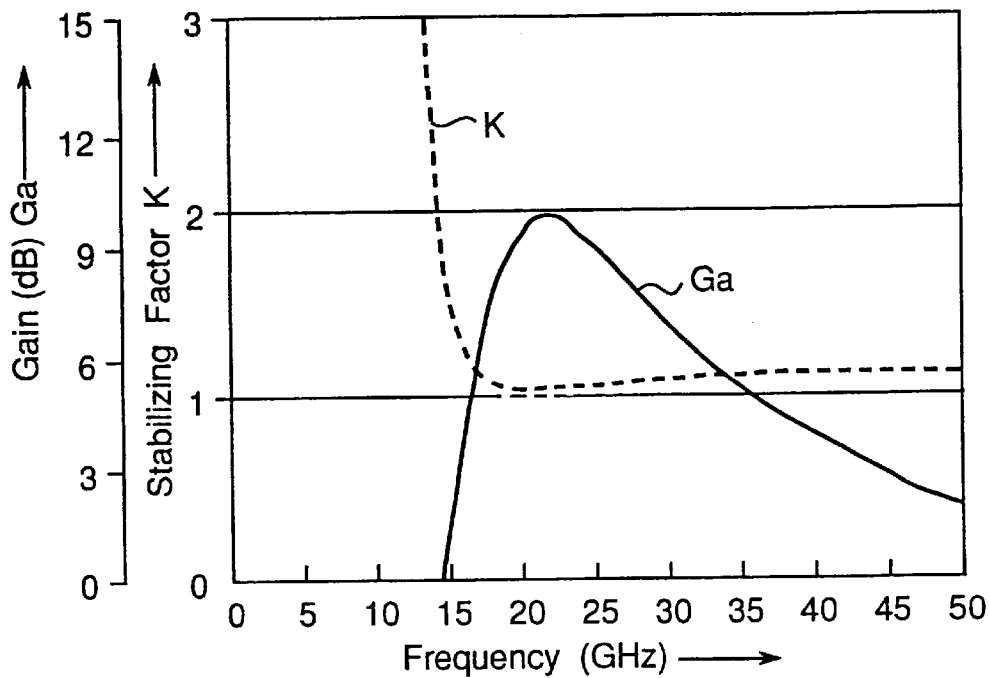
FIG. 21 is a graph showing a frequency characteristic of the microwave and millimeter wave amplifier circuit of the first preferred embodiment.
Figure 22:
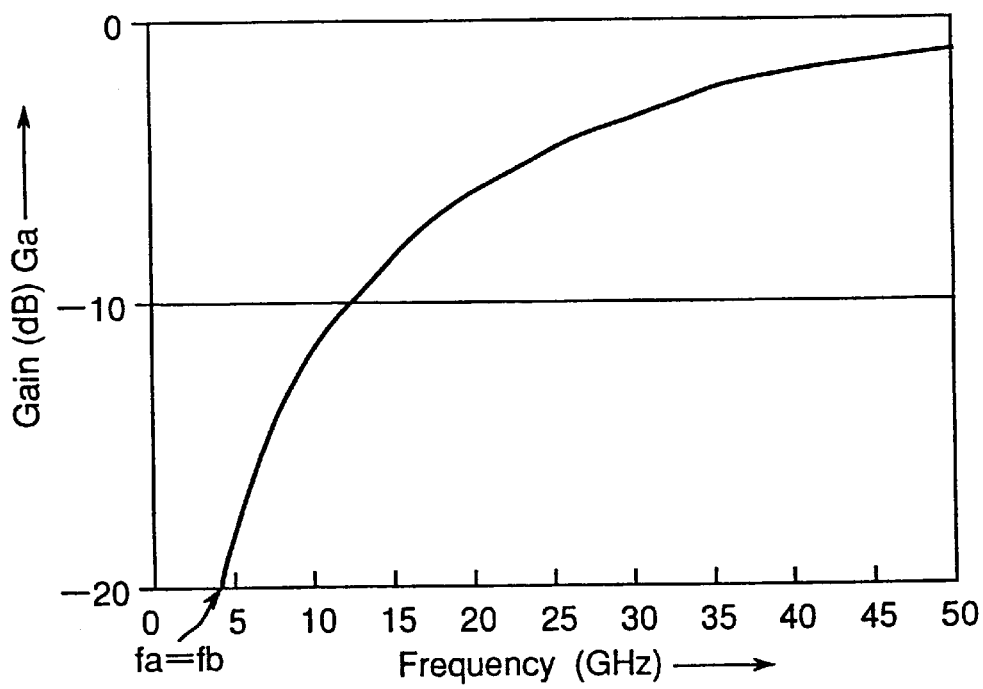
FIG. 22 is a graph showing a frequency characteristic of band elimination filters (BEFs) FA and FB.
Figure 23:
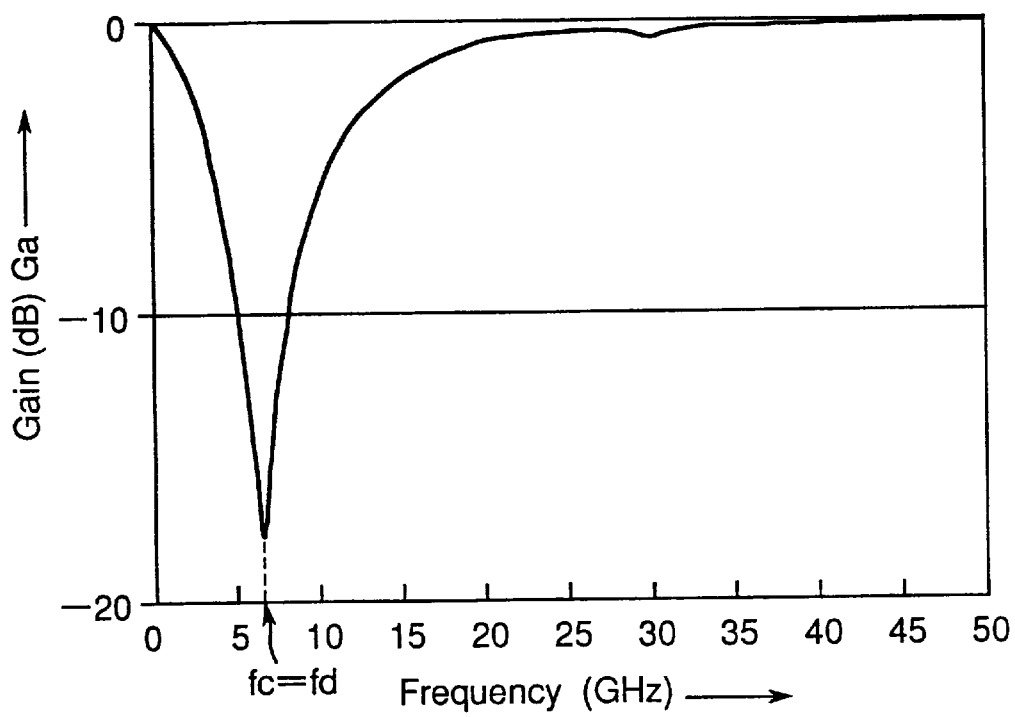
FIG. 23 is a graph showing a frequency characteristic of band elimination filters (BEFs) FC and FD.

Preferable device values for the individual devices in the microwave and millimeter wave amplifier circuit in the first preferred embodiment are as follows, where these device values are used in the preferred embodiment as illustrated in FIGS. 21 to 23:

$$L1 = L2 = 0.03\text{nH}, \quad (2)$$
$$L3 = L3a = 0.02\text{ nH},$$
$$L4 = L5 = 0\text{ nH},$$
$$L6 = L9 = 0.02\text{nH},$$
$$L7 = 0.07\text{nH},$$
$$L8 = 0.1\text{ nH}.$$

$$C1 = C2 = C3 = C4 = 0.3\text{pF}, \quad (3)$$
$$C5 = C6 = 10\text{pF}.$$

$$R1 = R2 = 50\,\Omega. \quad (4)$$

Preferable ranges for the device values in the microwave and millimeter wave amplifier circuit of the first preferred embodiment are as follows, wherein $w_1$ to $w_9$ and $w_{3a}$ are the widths of the microstrip lines T1 to T9 and T3a, respectively, and $l_1$ to $l_9$ and $l_{3a}$ are the lengths of the microstrip lines T1 to T9 and $T_{3a}$, respectively:

$$5\,\mu\text{m} \le w_1 = w_2 \le 500\,\mu\text{m}, \quad (5)$$
$$0 \le w_3 = w_{3a} = w_4 = w_5 = w_6 = w_7 = w_8 = w_9 \le 500\,\mu\text{m}.$$

$$8\,\mu\text{m} \le l_1 = l_2 \le 5000\,\mu\text{m}, \quad (6)$$
$$0 \le l_3 = l_{3a} = l_4 = l_5 \le 5000\,\mu\text{m},$$
$$0 \le l_6 \le 1000\,\mu\text{m},$$
$$0 \le l_7 = l_8 = l_9 \le 3000\,\mu\text{m}.$$

$$0.01\text{pF} \le C1 = C2 \le 20\text{pF}, \quad (7)$$
$$0.01\text{pF} \le C3 = C4 \le 0.9\text{pF},$$
$$1\text{pF} \le C5 = C6 \le 50\text{pF}.$$

$$0.01\,\Omega \le R1 \le 1000\,\Omega, \quad (8)$$
$$0 \le R2 \le 1000\,\Omega.$$

In the microwave and millimeter wave amplifier circuit constructed as described above, the absolute value of the ratio of output voltage $V_2$ to input voltage $V_1$ in the BEF circuit, which comprises the microstrip line T9 and the BEF FB, can be expressed by the following equation:

$$|V_2/V_1| = |-Z_L/[\{1 - \omega^2(L_9 + L_5)C_6\}/(1 - \omega^2 L_5 C_6) + j\omega L_g)]|. \quad (9)$$

The first term of the denominator in the right side of the Equation (9) gradually approaches $(L_9+L_5)/L_5$ at sufficiently high frequencies, such as millimeter waves. Also, the stopping frequency $f_b$ corresponding to the oscillation frequency of the inductor L5 and capacitor C6 of the BEF FB is preferably set to, for example, 3 GHz, a frequency in the microwave band. Therefore, the BEF circuit becomes a band elimination filter circuit which attenuates signals of lower frequencies.

More specifically, in the microwave and millimeter wave amplifier circuit of FIG. 1, a microwave and millimeter wave signal inputted to the input terminal 1 is band-eliminated at the stopping frequency $f_a$ by the BEF FA and is band-eliminated at the stopping frequency $f_c$ by the BEF FC, and then is inputted to the amplifier including the FET Q. The microwave and millimeter wave signal amplified by the FET Q is band-eliminated at the stopping frequency $f_d$ by the BEF FD and is band-eliminated at the stopping frequency $f_b$ by the BEF FB, and then is outputted via the output terminal 2.

Figure 12:
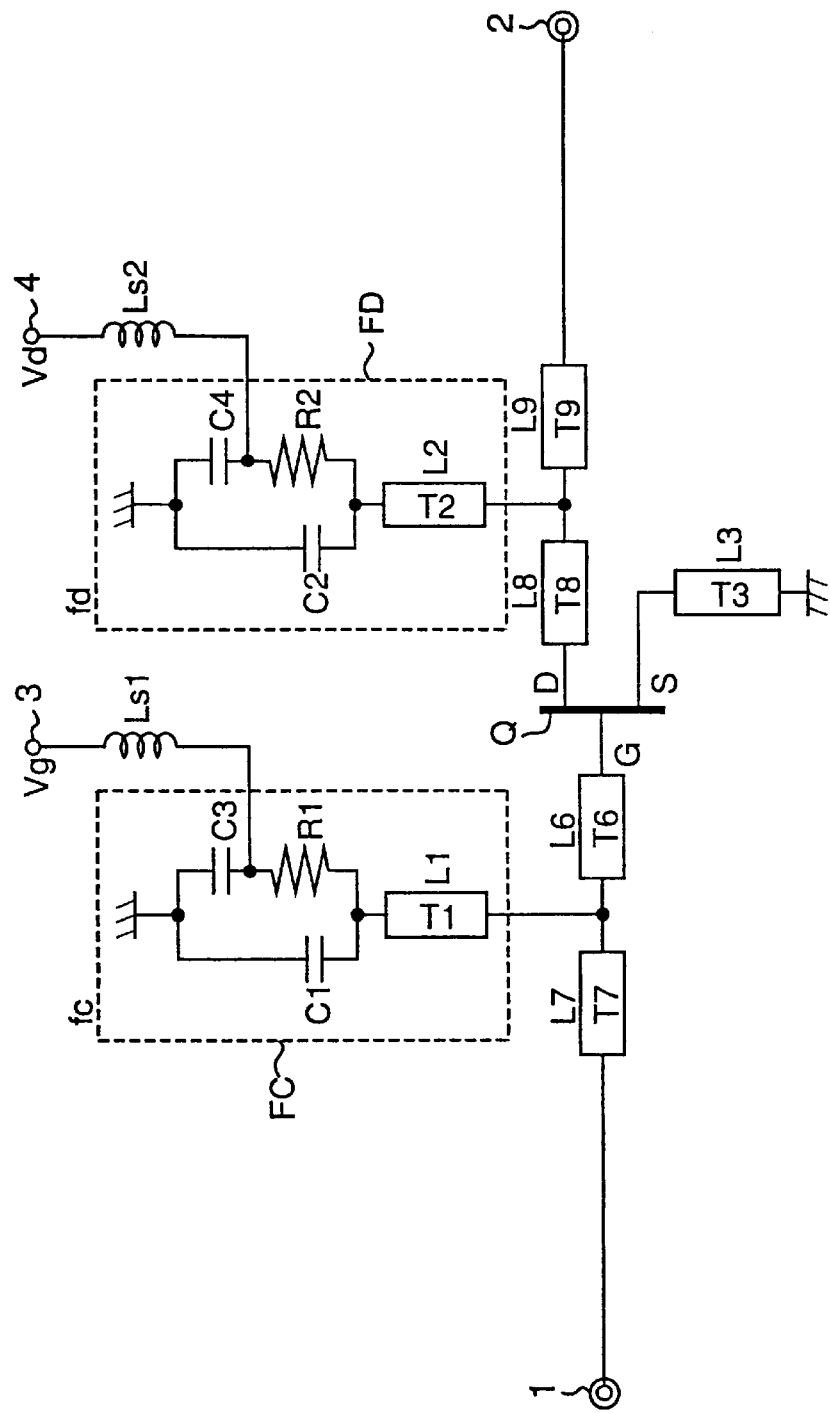
FIG. 12 is a circuit diagram of a microwave and millimeter wave amplifier circuit of a comparative example.
Figure 13:
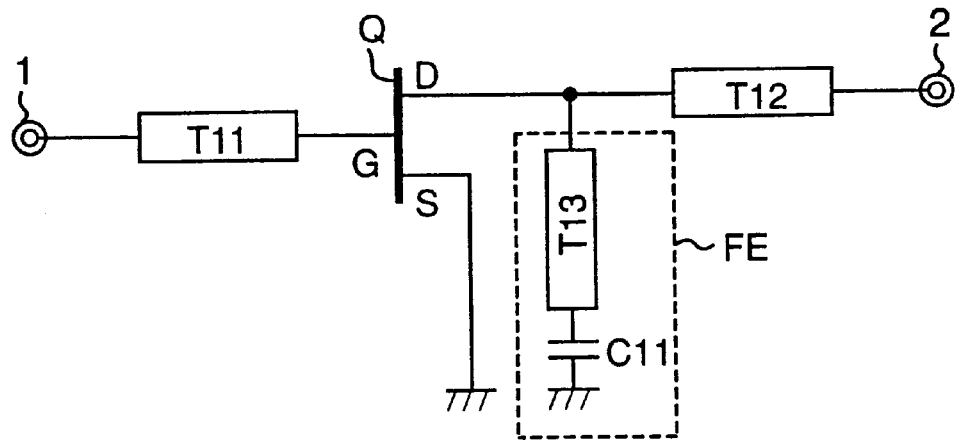
FIG. 13 is a circuit diagram of a microwave and millimeter wave amplifier circuit of a first prior art.
Figure 14:
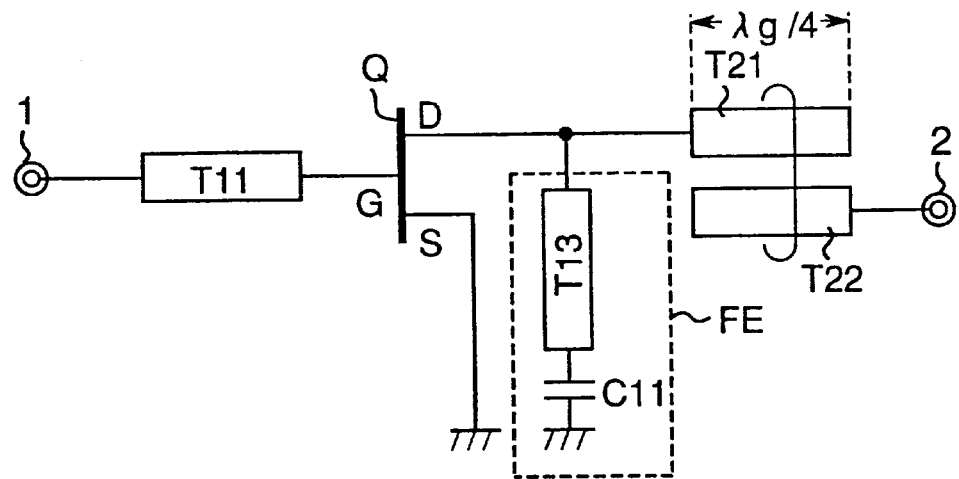
FIG. 14 is a circuit diagram of a microwave and millimeter wave amplifier circuit of a second prior art.
Figure 15:
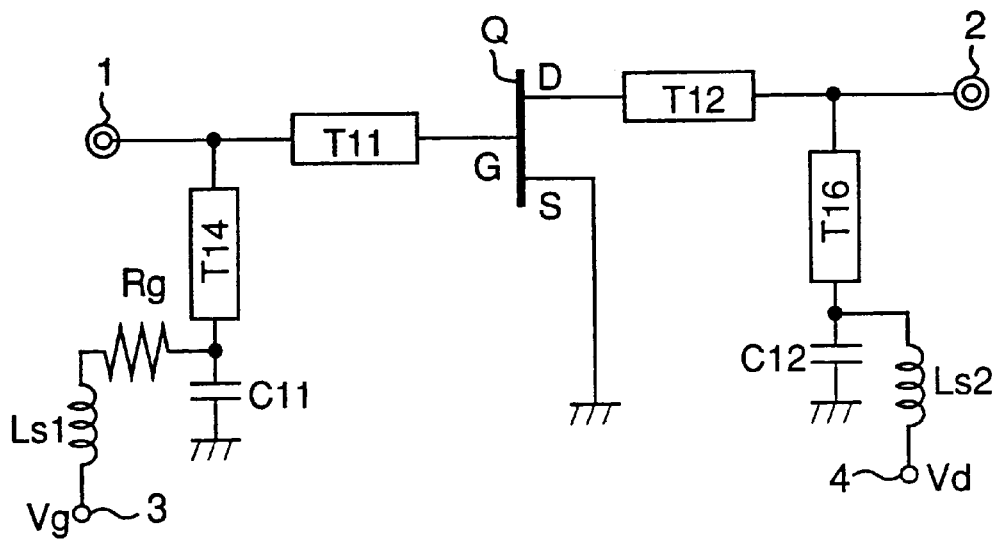
FIG. 15 is a circuit diagram of a microwave and millimeter wave amplifier circuit of a third prior art.
Figure 16:
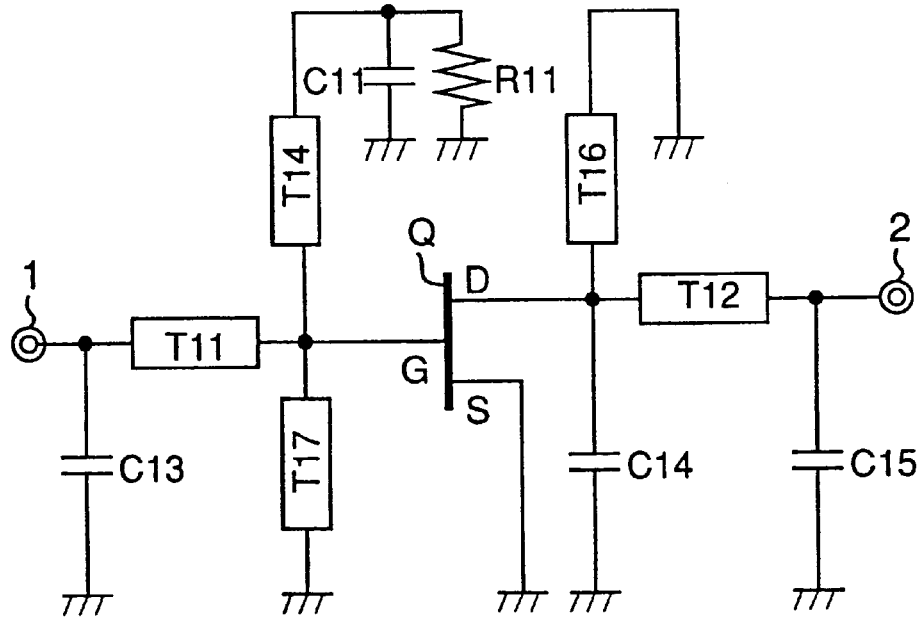
FIG. 16 is a circuit diagram of a microwave and millimeter wave amplifier circuit of a fourth prior art.
Figure 17:
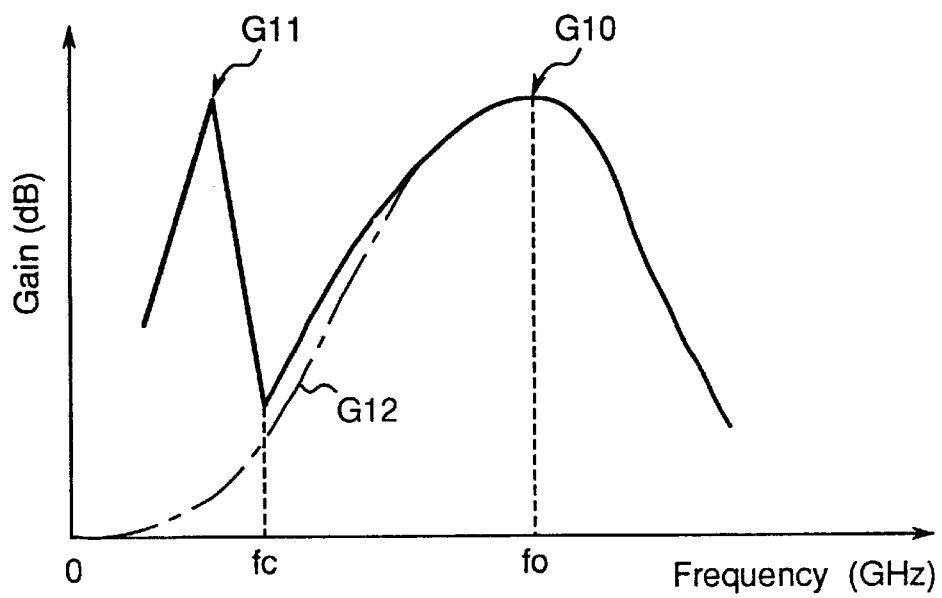
FIG. 17 is a graph showing frequency characteristics of the microwave and millimeter wave amplifier circuits of the first and second prior arts.
Figure 18:
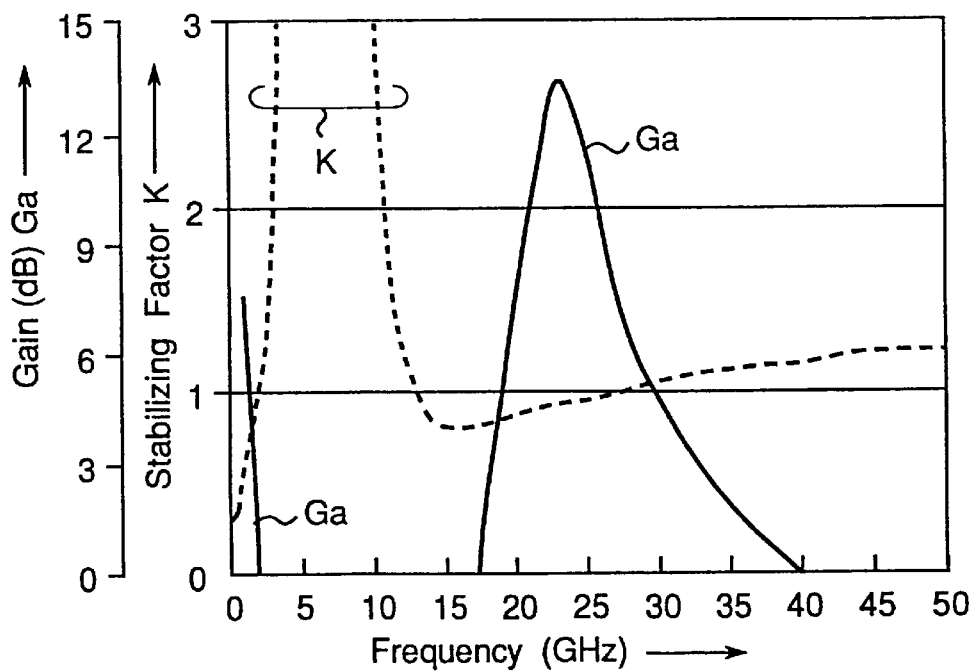
FIG. 18 is a graph showing a frequency characteristic of the microwave and millimeter wave amplifier circuit of the third prior art.
Figure 19:
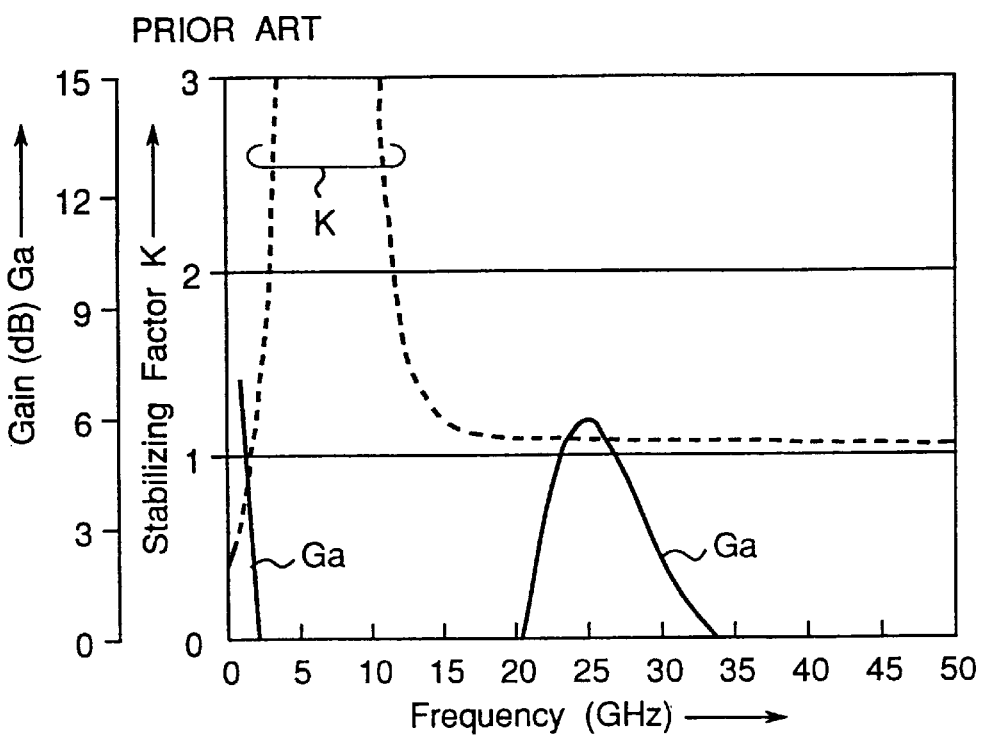
FIG. 19 is a graph showing a frequency characteristic of the microwave and millimeter wave amplifier circuit of the third prior art with a source inductor added.
Figure 20:
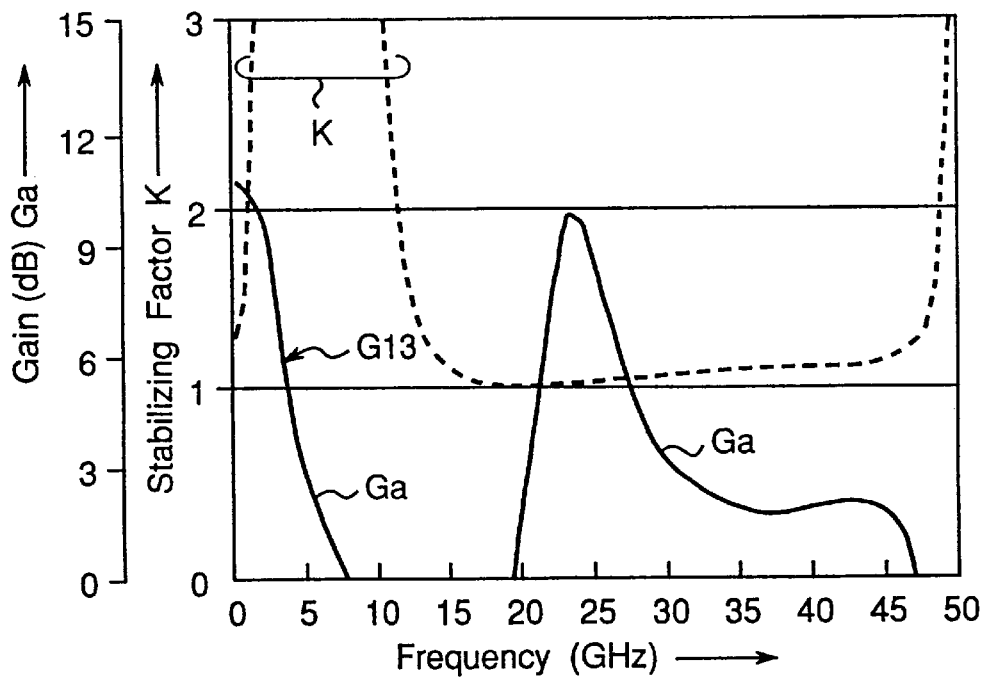
FIG. 20 is a graph showing a frequency characteristic of the microwave and millimeter wave amplifier circuit of the comparative example.

FIG. 12 is a circuit diagram of a microwave and millimeter wave amplifier circuit of a comparative example. In FIG. 12, the same components as those shown in FIG. 1 are designated by the same reference numerals. The microwave and millimeter wave amplifier circuit of the comparative example is characterized by not comprising the BEFs FA and FB and the microstrip line T3a, as compared with the microwave and millimeter wave amplifier circuit of FIG. 1. FIG. 20 is a graph showing a frequency characteristic of the microwave and millimeter wave amplifier circuit of the comparative example of FIG. 12. In this comparative example, as apparent from FIG. 20, there arises an unnecessary gain indicated by G13 in a manner similar to the first, third and fourth prior arts.

FIG. 22 is a graph showing a frequency characteristic of the BEFs FA and FB of FIG. 1, and FIG. 23 is a graph showing a frequency characteristic of the BEFs FC and FD. The amplification center frequency $f_0$ in the preferred embodiment of FIG. 1 is about 30 GHz, the stopping frequency $f_a \approx f_b$ is about 3 GHz as apparent from FIG. 22, and the stopping frequency $f_c \approx f_d$ is about 7 GHz as apparent from FIG. 23.

FIG. 21 is a graph showing a frequency characteristic of the microwave and millimeter wave amplifier circuit of the first preferred embodiment, in which the microstrip lines T4, T5 and T3 a are not provided. In FIGS. 20 and 21, the amplifier circuit operates stably when the stabilizing factor K is equal to or larger than one. As apparent from FIG. 21, in the microwave and millimeter wave amplifier circuit provided with the FET Q, combining the BEFs FA and FB with the BEFs FC and FD attenuates the unnecessary gain G13 as shown in FIG. 20, while the microwave and millimeter wave amplifier circuit has a larger gain in a wider frequency band, as compared with the prior arts, and provides a stable amplification. Further, since no directional coupler is used, the microwave and millimeter wave amplifier circuit can be miniaturized, as compared with the second prior art.

SECOND PREFERRED EMBODIMENT

Figure 2:
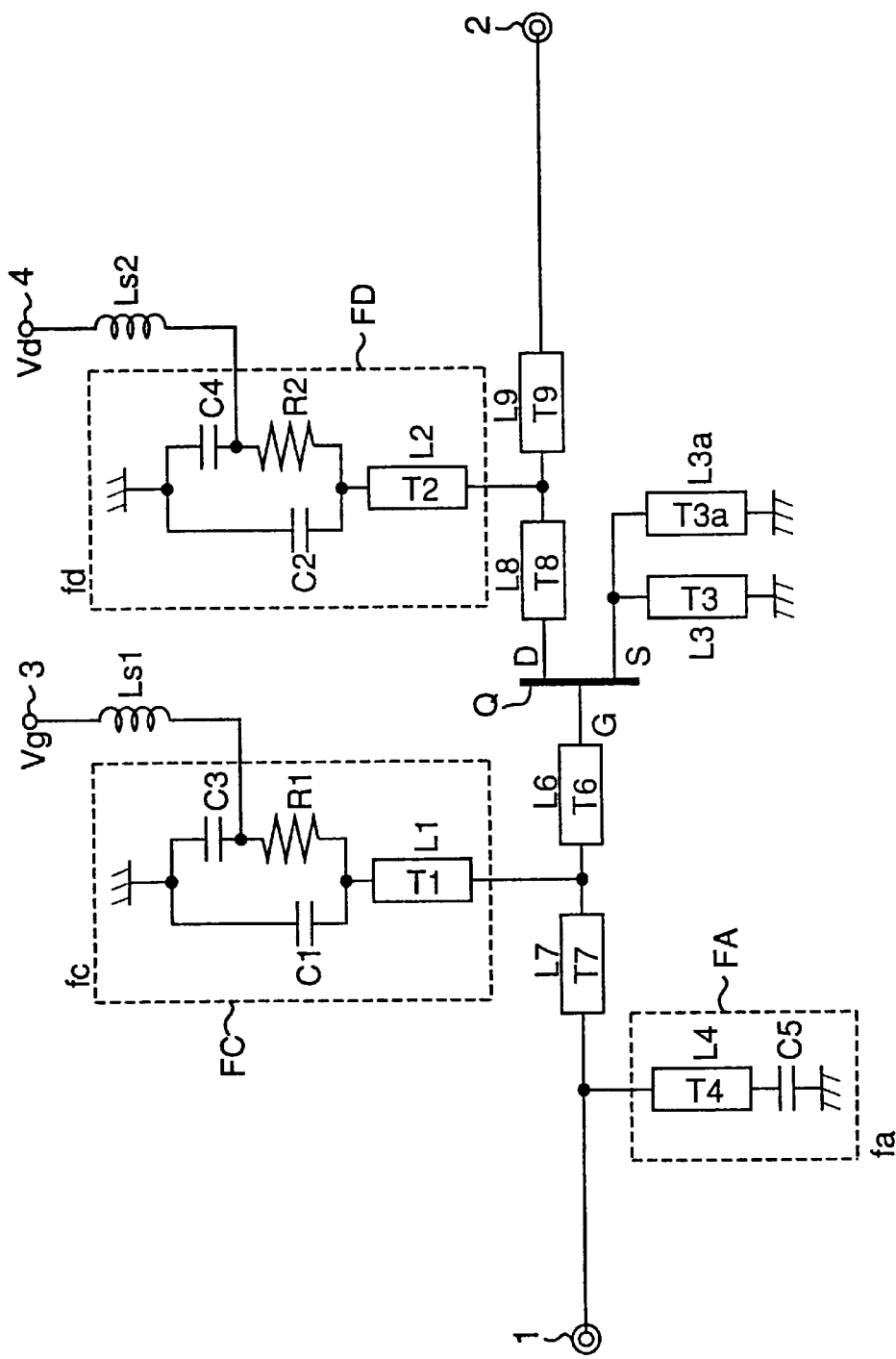
FIG. 2 is a circuit diagram of a microwave and millimeter wave amplifier circuit of a second preferred embodiment according to the present invention.

FIG. 2 is a circuit diagram of a microwave and millimeter wave amplifier circuit of the second preferred embodiment according to the present invention. In FIG. 2, the same components as those shown in FIG. 1 are designated by the same reference numerals. The microwave and millimeter wave amplifier circuit of this preferred embodiment is characterized by not comprising the BEF FB, as compared with the first preferred embodiment of FIG. 1.

In the microwave and millimeter wave amplifier circuit constructed as described above, a microwave and millimeter wave signal inputted to the input terminal 1 is band-eliminated at the stopping frequency $f_a$ by the BEF FA and is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_d$ by the BEF FD, and then is outputted via the output terminal 2.

Therefore, in the microwave and millimeter wave amplifier circuit provided with the FET Q, combining the BEF FA with the BEFs FC and FD attenuated the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

THIRD PREFERRED EMBODIMENT

Figure 3:
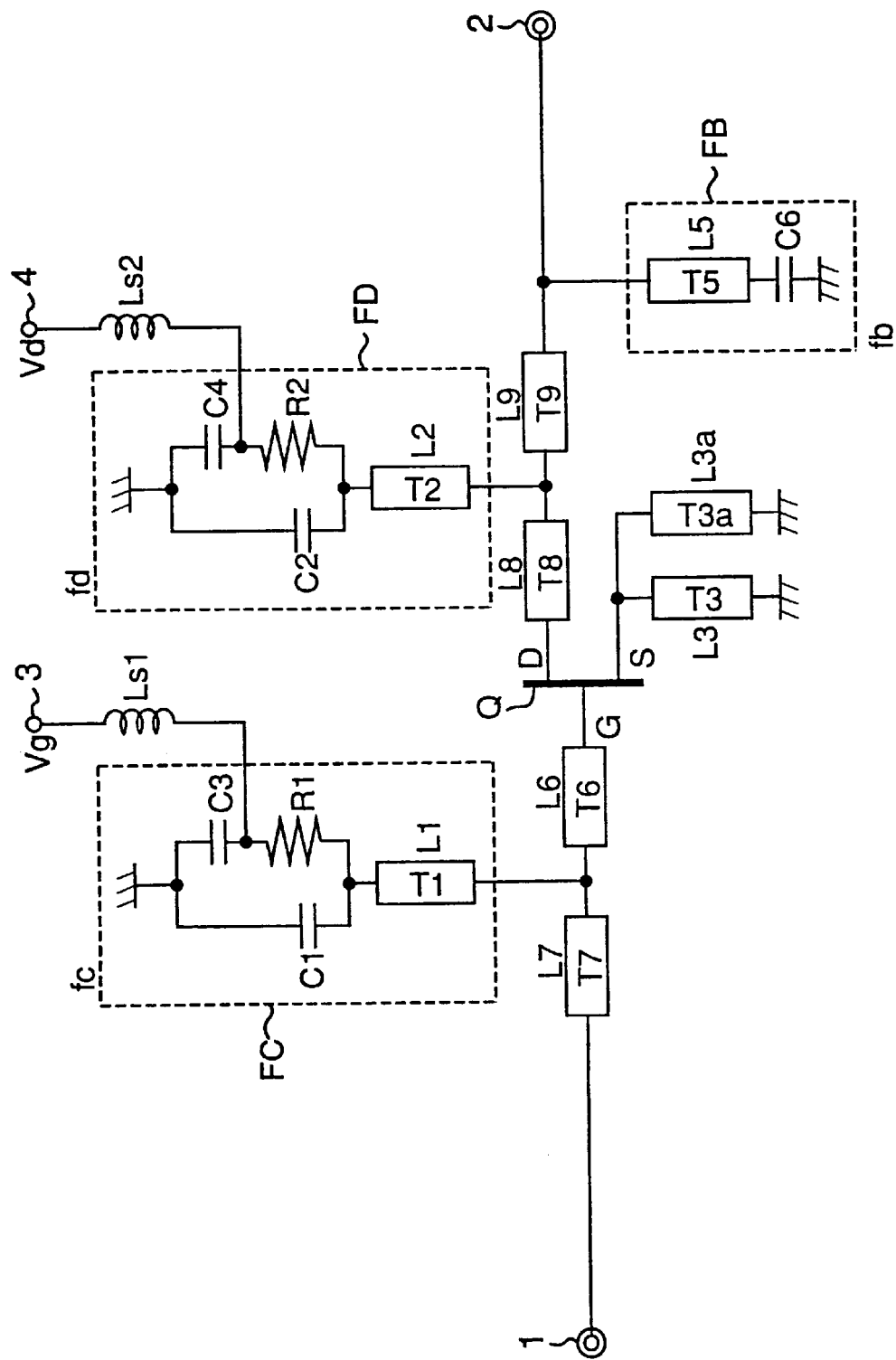
FIG. 3 is a circuit diagram of a microwave and millimeter wave amplifier circuit of a third preferred embodiment according to the present invention.

FIG. 3 is a circuit diagram of a microwave and millimeter wave amplifier circuit of a third preferred embodiment according to the present invention. In FIG. 3, the same components as those shown in FIG. 1 are designated by the same reference numerals. The microwave and millimeter wave amplifier circuit of this preferred embodiment is characterized by not comprising the BEF FA, as compared with the first preferred embodiment of FIG. 1.

In the microwave and millimeter wave amplifier circuit constructed as described above, a microwave and millimeter wave signal inputted to the input terminal 1 is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_d$ by the BEF FD and is band-eliminated at the stopping frequency $f_b$ by the BEF FB, and then is outputted via the output terminal 2.

Therefore, in the microwave and millimeter wave amplifier circuit provided with the FET Q, combining the BEF FB with the BEFs FC and FD attenuates the unnecessary gain G13 as shown in FIG. 20, while the microwave and millimeter wave amplifier circuit has a larger gain in a wider frequency band, as compared with the prior arts, and provides a stable amplification. Further, since no directional coupler is used, the microwave and millimeter wave amplifier circuit can be miniaturized, as compared with the second prior art.

FOURTH PREFERRED EMBODIMENT

Figure 4:
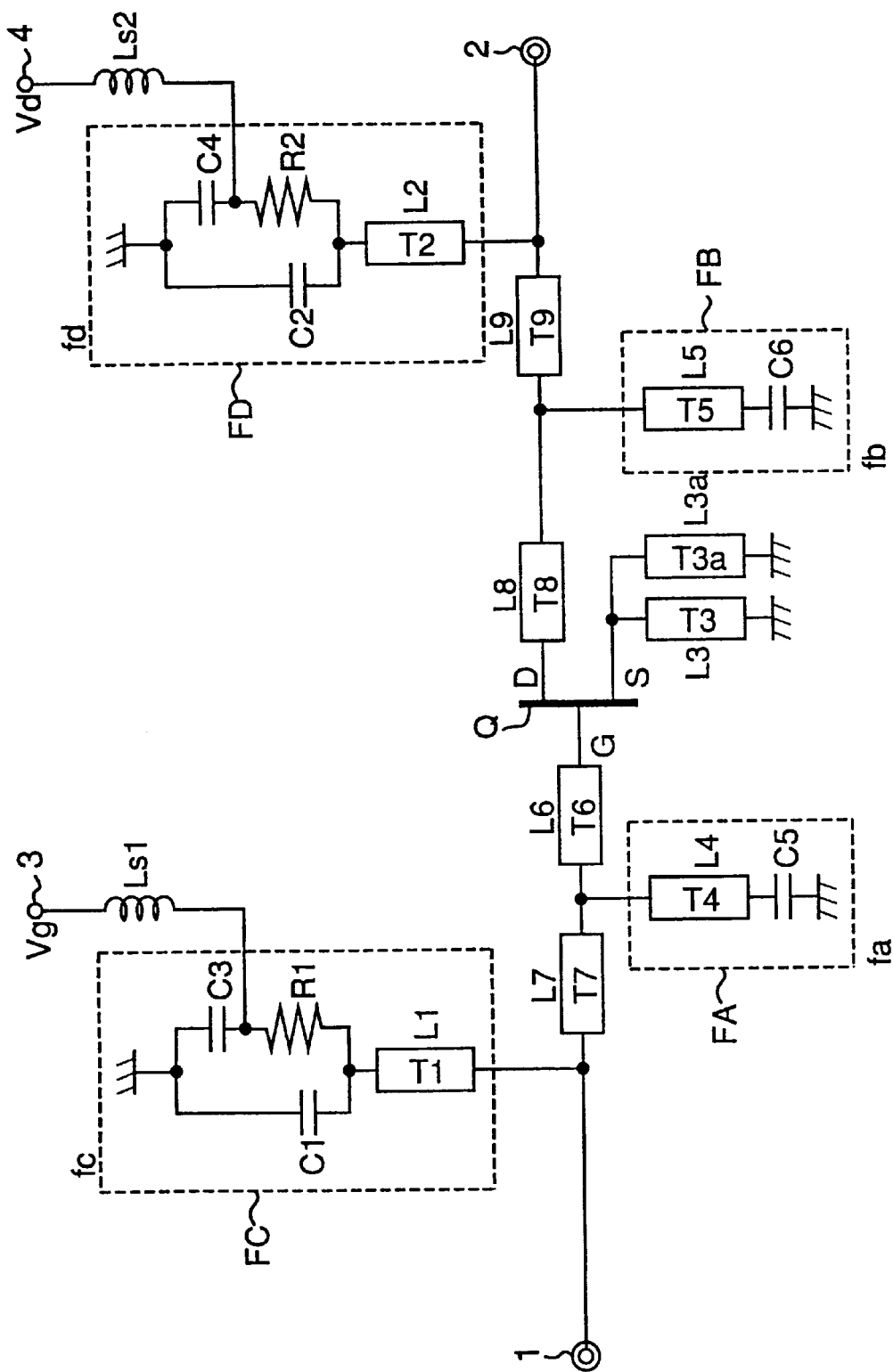
FIG. 4 is a circuit diagram of a microwave and millimeter wave amplifier circuit of a fourth preferred embodiment according to the present invention.

FIG. 4 is a circuit diagram of a microwave and millimeter wave amplifier circuit of a fourth preferred embodiment according to the present invention. In FIG. 4, the same components as those shown in FIG. 1 are designated by the same reference numerals. The microwave and millimeter wave amplifier circuit of this preferred embodiment is characterized, as compared with the first preferred embodiment of FIG. 1, in that:

(a) the BEF FA is connected to a connecting point between the microstrip lines T6 and T7;

(b) the BEF FB is connected to a connecting point between the microstrip lines T8 and T9;

(c) the BEF FC is connected to the input terminal 1; and (d) the BEF FD is connected to the output terminal 2.

In the microwave and millimeter wave amplifier circuit constructed as described above, a microwave and millimeter wave signal inputted to the input terminal 1 is band-eliminated at the stopping frequency $f_c$ by the BEF FC and is band-eliminated at the stopping frequency $f_a$ by the BEF FA, and then is inputted to the amplifier provided with the FET Q. The microwave and millimeter wave signal amplified by the FET Q is band-eliminated at the stopping frequency $f_b$ by the BEF FB and is band-eliminated at the stopping frequency $f_d$ by the BEF FD, and then is outputted via the output terminal 2.

Therefore, in the microwave and millimeter wave amplifier circuit provided with the FET Q, combining the BEFs FA and FB with the BEFs FC and FD attenuates the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

FIFTH PREFERRED EMBODIMENT

Figure 5:
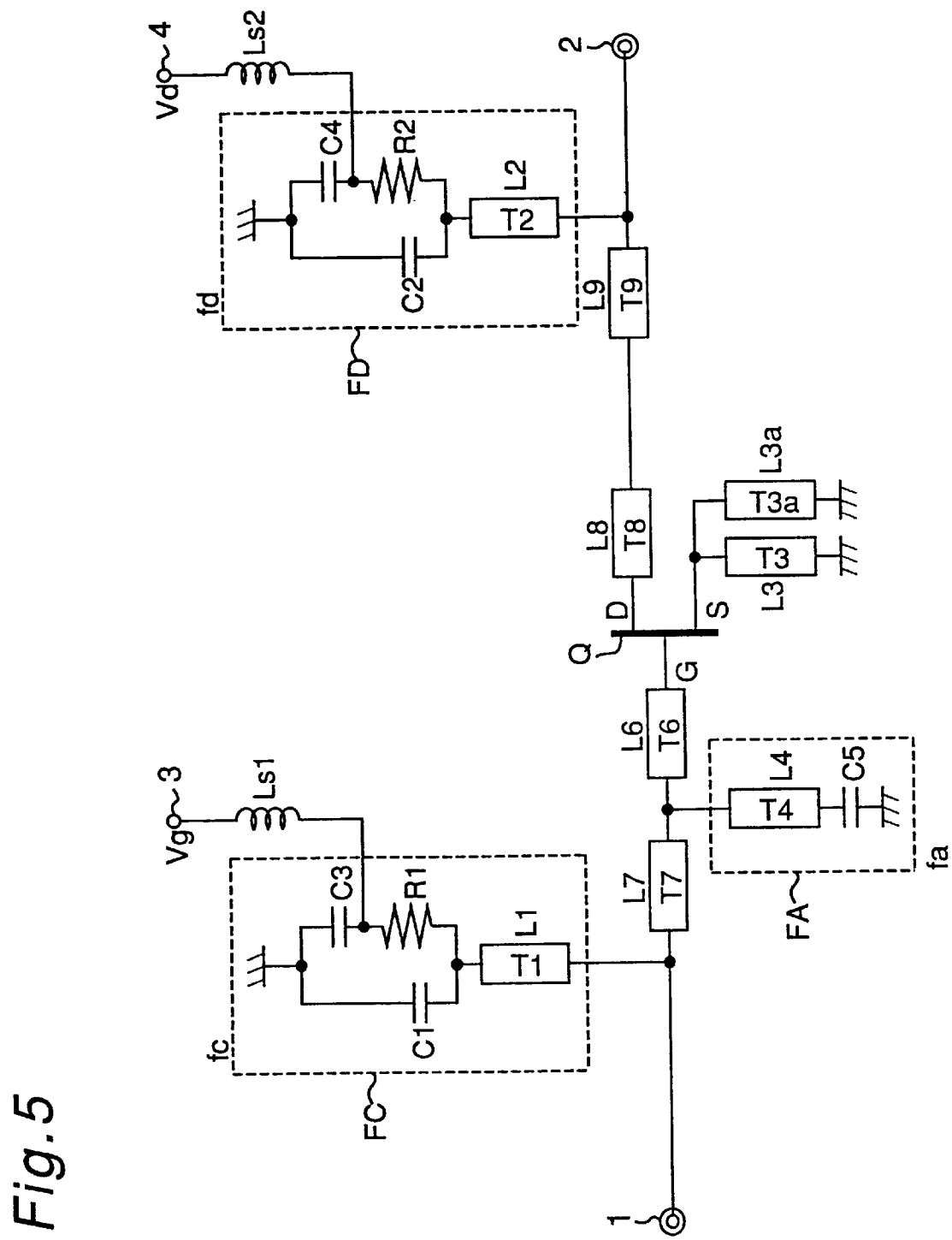
FIG. 5 is a circuit diagram of a microwave and millimeter wave amplifier circuit of a fifth preferred embodiment according to the present invention.

FIG. 5 is a circuit diagram of a microwave and millimeter wave amplifier circuit of a fifth preferred embodiment according to the present invention. In FIG. 5, the same components as those shown in FIG. 4 are designated by the same reference numerals. The microwave and millimeter wave amplifier circuit of this preferred embodiment is characterized by not comprising the BEF FB, as compared with the fourth preferred embodiment of FIG. 4.

In the microwave and millimeter wave amplifier circuit constructed as described above, a microwave and millimeter wave signal inputted to the input terminal 1 is band-eliminated at the stopping frequency $f_c$ by the BEF FC and is band-eliminated at the stopping frequency $f_a$ by the BEF FA, and then is inputted to the amplifier provided with the FET Q. The microwave and millimeter wave signal amplified by the FET Q is band-eliminated at the stopping frequency $f_d$ by the BEF FD, and then is outputted via the output terminal 2.

Therefore, in the microwave and millimeter wave amplifier circuit provided with the FET Q, combining the BEF FA with the BEFs FC and FD attenuated the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

SIXTH PREFERRED EMBODIMENT

Figure 6:
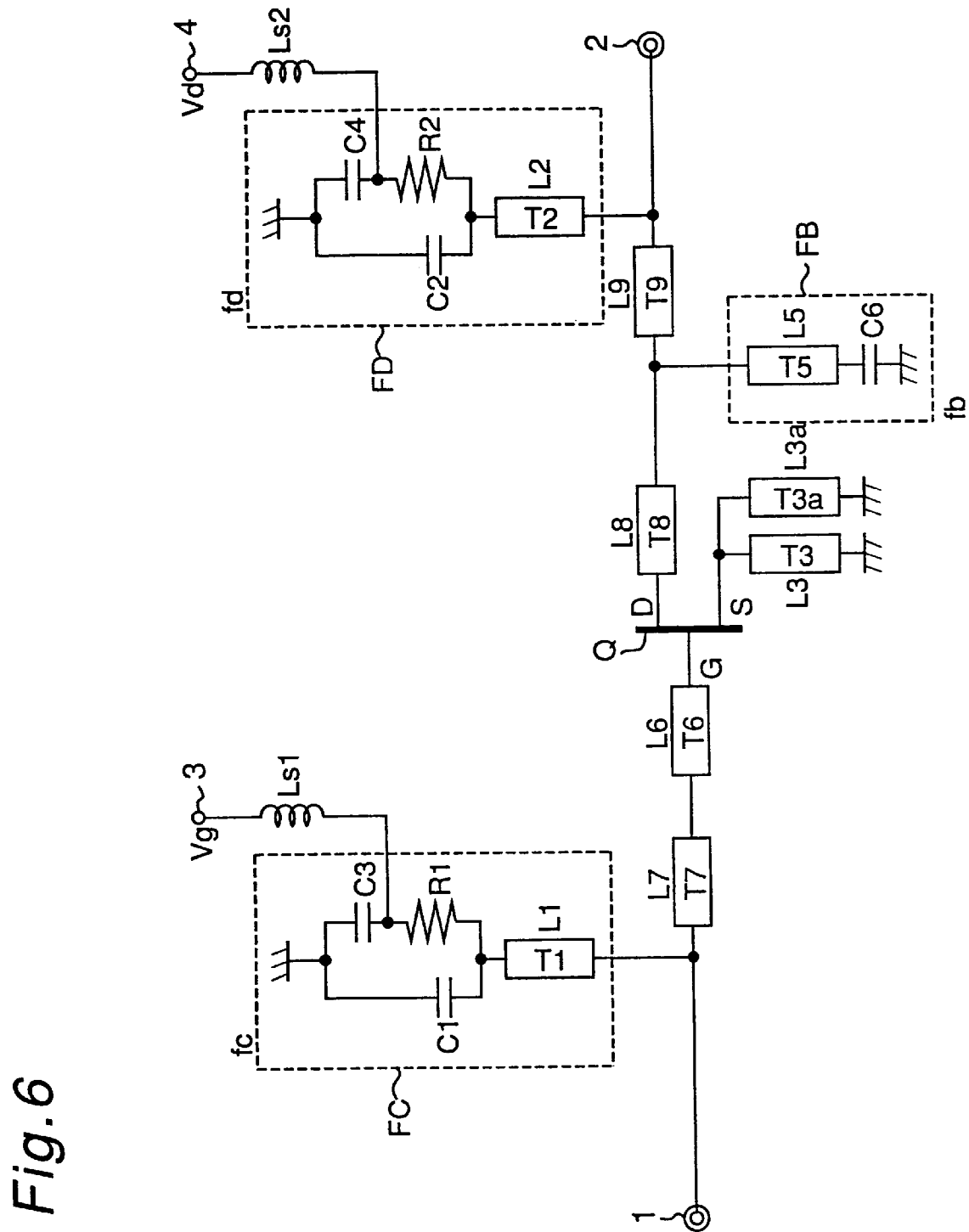
FIG. 6 is a circuit diagram of a microwave and millimeter wave amplifier circuit of a sixth preferred embodiment according to the present invention.

FIG. 6 is a circuit diagram of a microwave and millimeter wave amplifier circuit of a sixth preferred embodiment according to the present invention. In FIG. 6, the same components as those shown in FIG. 4 are designated by the same reference numerals. The microwave and millimeter wave amplifier circuit of this preferred embodiment is characterized by not comprising the BEF FA, as compared with the fourth preferred embodiment of FIG. 4.

In the microwave and millimeter wave amplifier circuit constructed as described above, a microwave and millimeter wave signal inputted to the input terminal 1 is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_b$ by the BEF FB and is band-eliminated at the stopping frequency $f_d$ by the BEF FD, and then is outputted via the output terminal 2.

Therefore, in the microwave and millimeter wave amplifier circuit provided with the FET Q, combining the BEF FB with the BEFs FC and FD attenuates the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

SEVENTH PREFERRED EMBODIMENT

Figure 7:
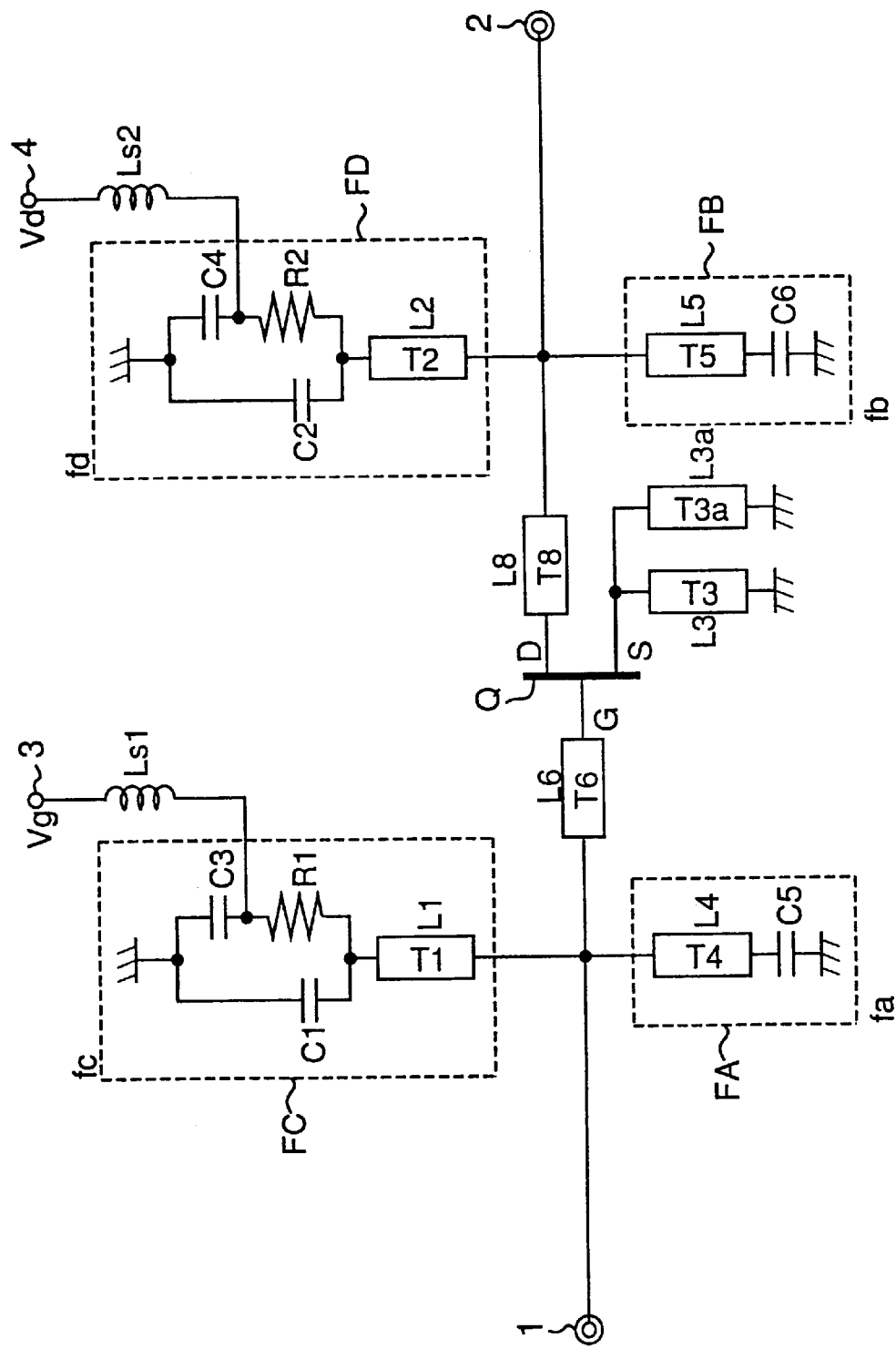
FIG. 7 is a circuit diagram of a microwave and millimeter wave amplifier circuit of a seventh preferred embodiment according to the present invention.

FIG. 7 is a circuit diagram of a microwave and millimeter wave amplifier circuit of a seventh preferred embodiment according to the present invention. In FIG. 7, the same components as those shown in FIGS. 1 and 4 are designated by the same reference numerals. The microwave and millimeter wave amplifier circuit of this preferred embodiment is characterized, as compared with the first preferred embodiment of FIG. 1, in that:

(a) the BEFs FA and FC are connected to the input terminal 1;
(b) the BEFs FB and FD are connected to the output terminal 2; and
(c) the amplifier circuit does not comprise the microstrip lines T7 and T9.

In the microwave and millimeter wave amplifier circuit constructed as described above, a microwave and millimeter wave signal inputted to the input terminal 1 is band-eliminated at the stopping frequency $f_c$ by the BEF FC and is band-eliminated at the stopping frequency $f_a$ by the BEF FA, and then is inputted to the amplifier provided with the FET Q. The microwave and millimeter wave signal amplified by the FET Q is band-eliminated at the stopping frequency $f_b$ by the BEF FB and is band-eliminated at the stopping frequency $f_d$ by the BEF FD, and then is outputted via the output terminal 2.

Therefore, in the microwave and millimeter wave amplifier circuit provided with the FET Q, combining the BEFs FA and FB with the BEFs FC and FD attenuates the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

EIGHTH PREFERRED EMBODIMENT

Figure 8:
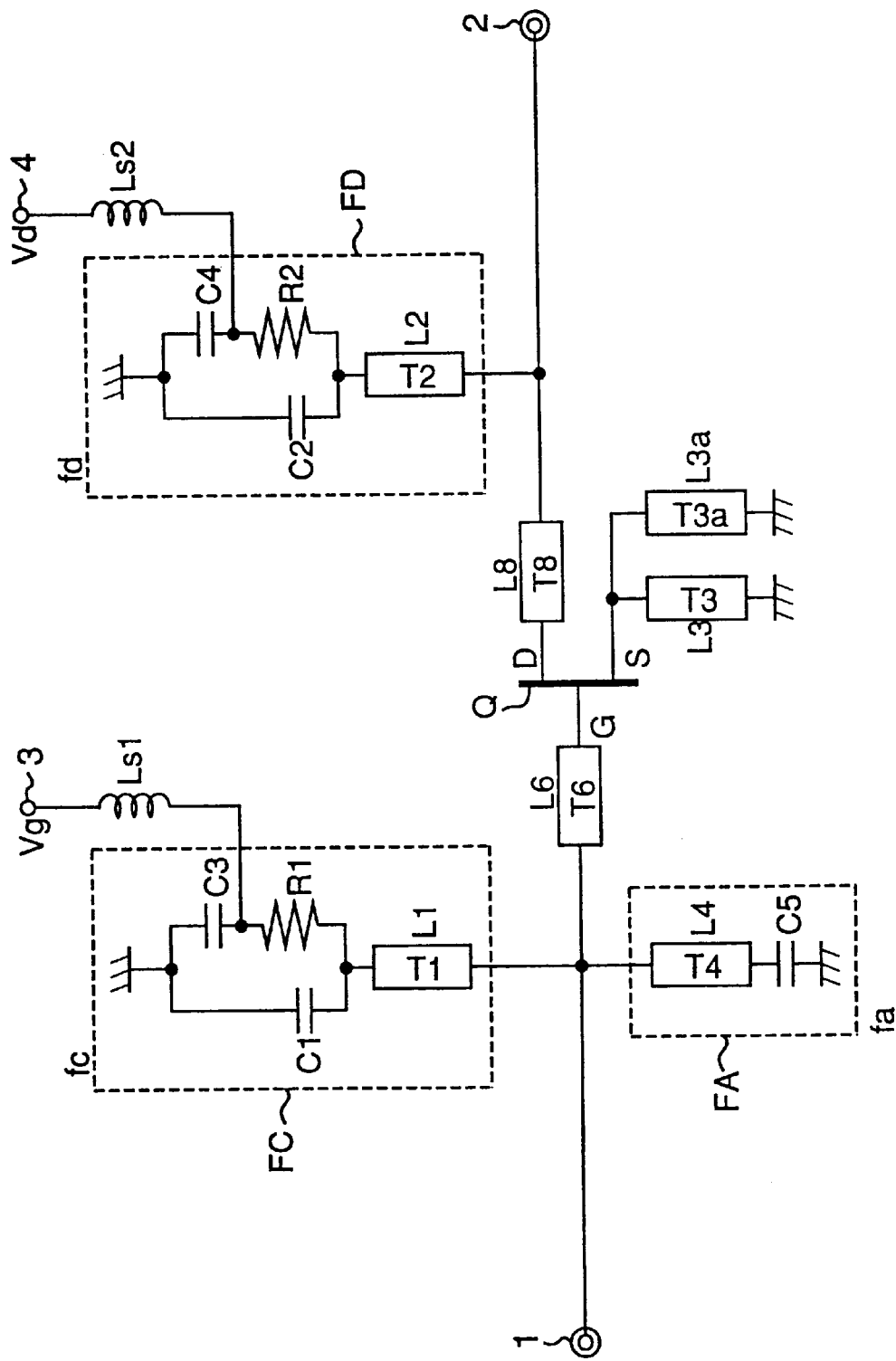
FIG. 8 is a circuit diagram of a microwave and millimeter wave amplifier circuit of an eighth preferred embodiment according to the present invention.

FIG. 8 is a circuit diagram of a microwave and millimeter wave amplifier circuit of an eighth preferred embodiment according to the present invention. In FIG. 8, the same components as those shown in FIG. 7 are designated by the same reference numerals. The microwave and millimeter wave amplifier circuit of this preferred embodiment is characterized by not comprising the BEF FB, as compared with the seventh preferred embodiment of FIG. 7.

In the microwave and millimeter wave amplifier circuit constructed as described above, a microwave and millimeter wave signal inputted to the input terminal 1 is band-eliminated at the stopping frequency $f_a$ by the BEF FA and is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_d$ by the BEF FD, and then is outputted via the output terminal 2.

Therefore, in the microwave and millimeter wave amplifier circuit provided with the FET Q, combining the BEF FA with the BEFs FC and FD attenuates the unnecessary gain G13 as shown in FIG. 20, while the microwave and millimeter wave amplifier circuit has a larger gain in a wider frequency band, as compared with the prior arts, and provides a stable amplification. Further, since no directional coupler is used, the microwave and millimeter wave amplifier circuit can be miniaturized, as compared with the second prior art.

NINTH PREFERRED EMBODIMENT

Figure 9:
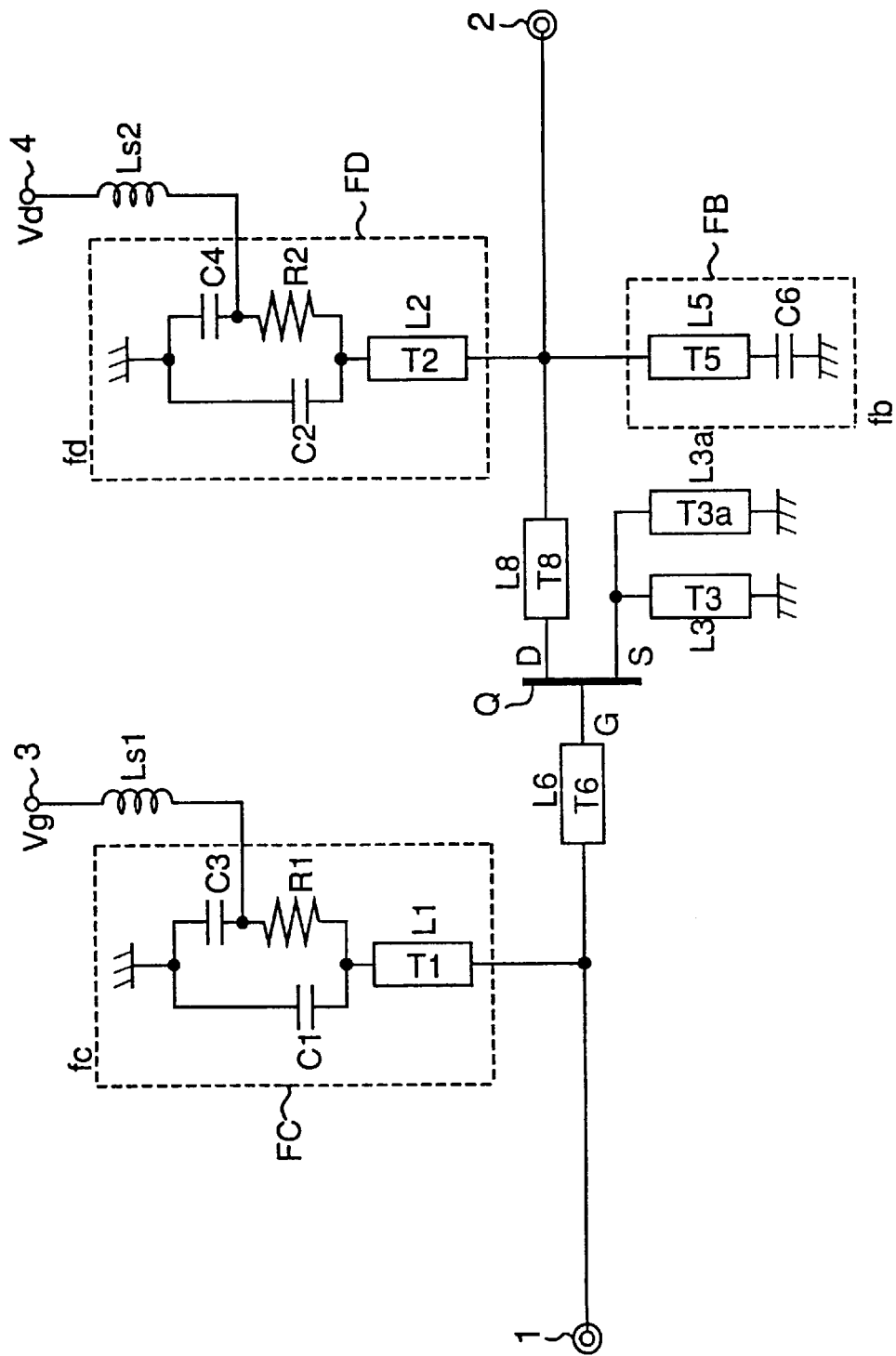
FIG. 9 is a circuit diagram of a microwave and millimeter wave amplifier circuit of a ninth preferred embodiment according to the present invention.

FIG. 9 is a circuit diagram of a microwave and millimeter wave amplifier circuit of a ninth preferred embodiment according to the present invention. In FIG. 9, the same components as those shown in FIG. 7 are designated by the same reference numerals. The microwave and millimeter wave amplifier circuit of this preferred embodiment is characterized by not comprising the BEF FA, as compared with the seventh preferred embodiment of FIG. 7.

In the microwave and millimeter wave amplifier circuit constructed as described above, a microwave and millimeter wave signal inputted to the input terminal 1 is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_d$ by the BEF FD and is band-eliminated at the stopping frequency $f_b$ by the BEF FB, and then is outputted via the output terminal 2.

Therefore, in the microwave and millimeter wave amplifier circuit provided with the FET Q, combining the BEF FB with the BEFs FC and FD attenuates the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

TENTH PREFERRED EMBODIMENT

Figure 10:
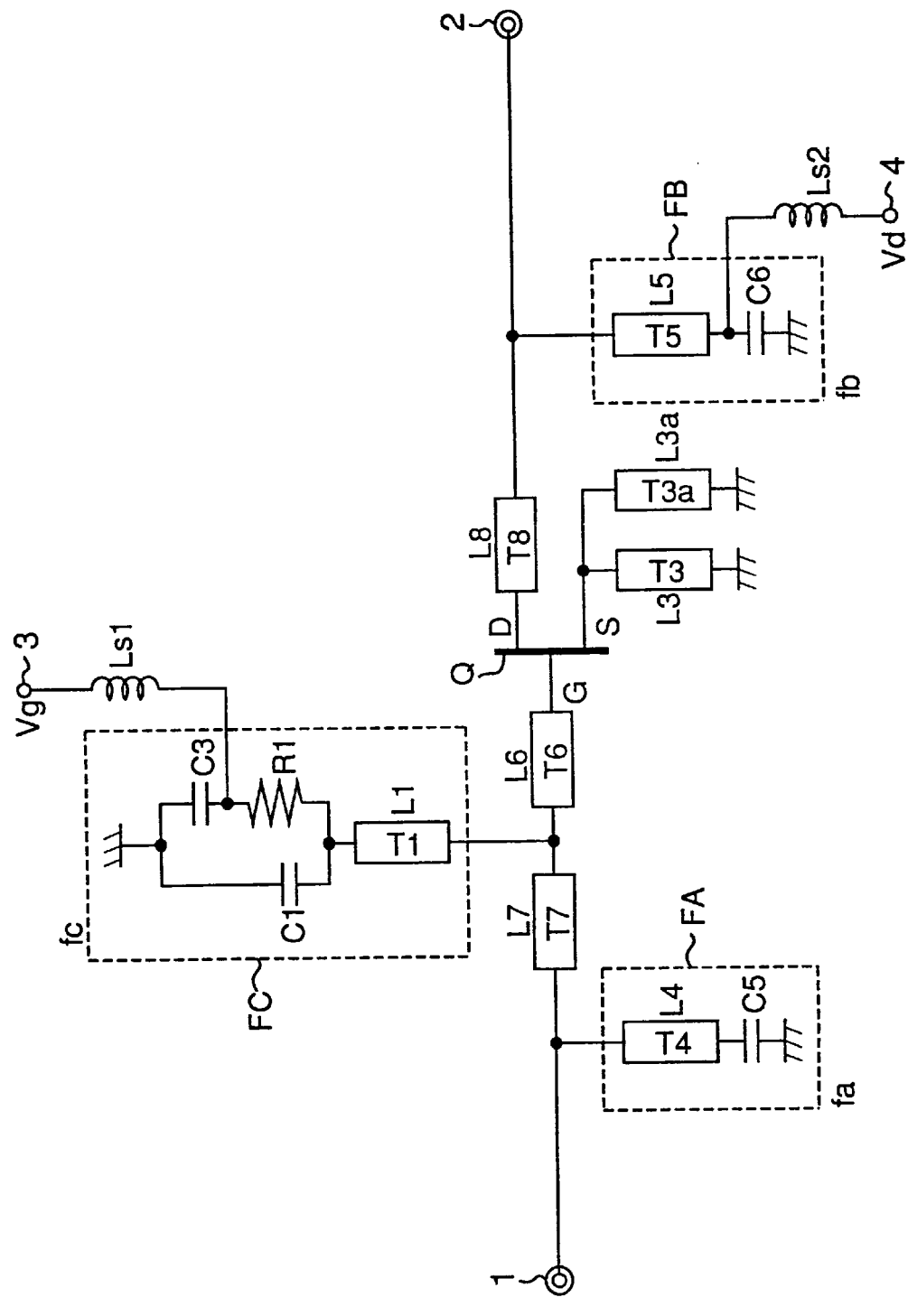
FIG. 10 is a circuit diagram of a microwave and millimeter wave amplifier circuit of a tenth preferred embodiment according to the present invention.

FIG. 10 is a circuit diagram of a microwave and millimeter wave amplifier circuit of a tenth preferred embodiment according to the present invention. In FIG. 10, the same components as those shown in FIG. 1 are designated by the same reference numerals. The microwave and millimeter wave amplifier circuit of this preferred embodiment is characterized, as compared with the first preferred embodiment of FIG. 1, in that:

(a) the amplifier circuit does not comprise the BEF FD;
(b) the amplifier circuit does not comprise the microstrip line T9; and
(c) a connecting point between the microstrip line T5 and the capacitor C6 is connected to the bias applying terminal 4 via the high-frequency stopping inductor Ls2.

In the microwave and millimeter wave amplifier circuit constructed as described above, a microwave and millimeter wave signal inputted to the input terminal 1 is band-eliminated at the stopping frequency $f_a$ by the BEF FA and is band-eliminated at the stopping frequency $f_c$ by the BEF FC, and then is inputted to the amplifier provided with the FET Q. The microwave and millimeter wave signal amplified by the FET Q is band-eliminated at the stopping frequency $f_b$ by the BEF FB, and then is outputted via the output terminal 2.

Therefore, in the microwave and millimeter wave amplifier circuit provided with the FET Q, combining the BEFs FA and FB with the BEF FC attenuates the unnecessary gain G13 as shown in FIG. 20, while the microwave and millimeter wave amplifier circuit has a larger gain in a wider frequency band, as compared with the prior arts, and provides stable amplification. Further, since no directional coupler is used, the microwave and millimeter wave amplifier circuit can be miniaturized, as compared with the second prior art.

ELEVENTH PREFERRED EMBODIMENT

Figure 11:
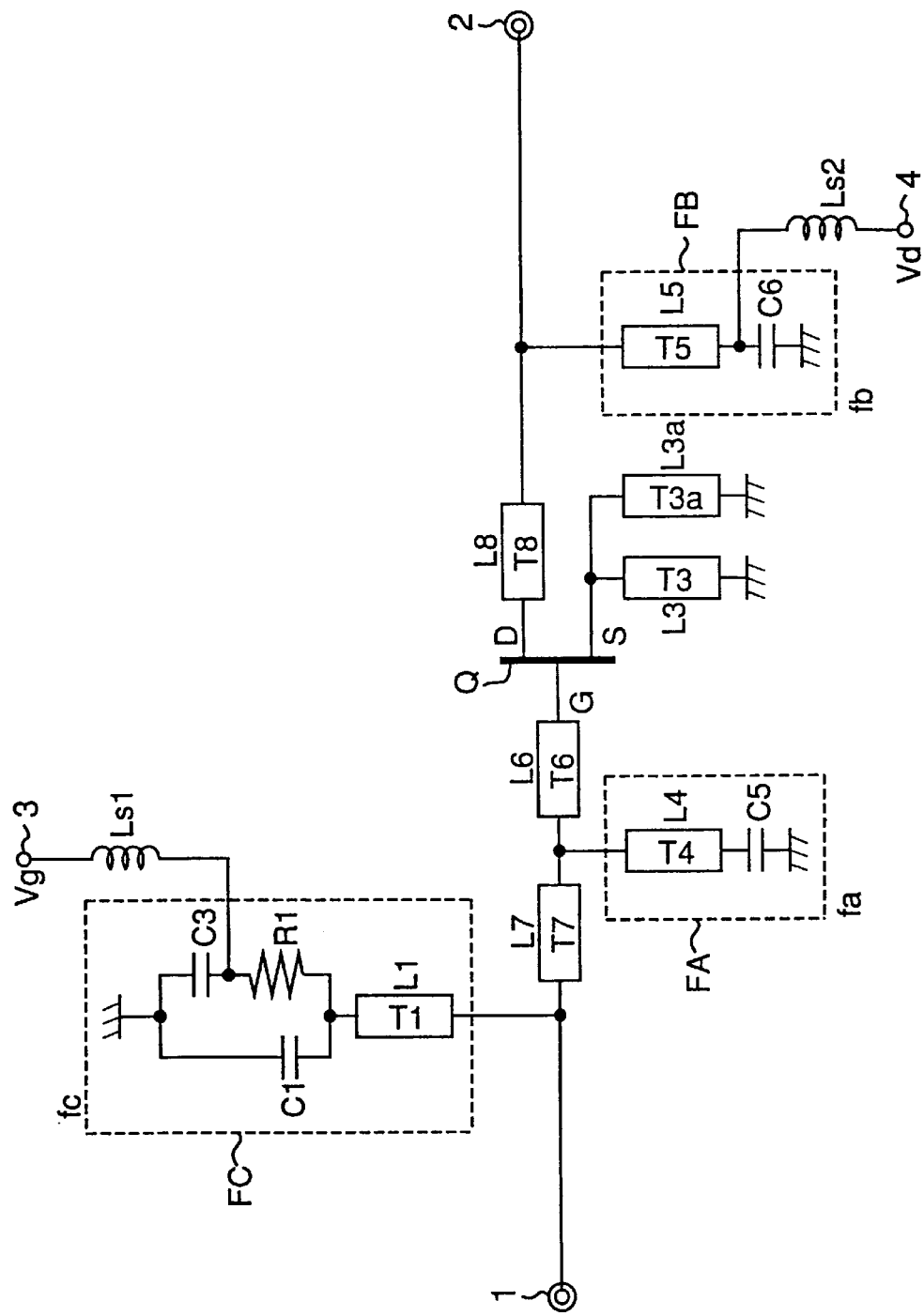
FIG. 11 is a circuit diagram of a microwave and millimeter wave amplifier circuit of an eleventh preferred embodiment according to the present invention.

FIG. 11 is a circuit diagram of a microwave and millimeter wave amplifier circuit of an eleventh preferred embodiment according to the present invention. In FIG. 11, the same components as those shown in FIGS. 1 and 4 are designated by the same reference numerals. The microwave and millimeter wave amplifier circuit of this preferred embodiment is characterized, as compared with the fourth preferred embodiment of FIG. 4, in that:

(a) the amplifier circuit does not comprise the BEF FD;
(b) the amplifier circuit does not comprise the microstrip line T9; and
(c) a connecting point between the microstrip line T5 and the capacitor C6 is connected to the bias applying terminal 4 via the high-frequency stopping inductor Ls2.

In the microwave and millimeter wave amplifier circuit constructed as described above, a microwave and millimeter wave signal inputted to the input terminal 1 is band-eliminated at the stopping frequency $f_c$ by the BEF FC and is band-eliminated at the stopping frequency $f_a$ by the BEF FA, and then is inputted to the amplifier provided with the FET Q. The microwave and millimeter wave signal amplified by the FET Q is band-eliminated at the stopping frequency $f_b$ by the BEF FB, and then is outputted via the output terminal 2.

Therefore, in the microwave and millimeter wave amplifier circuit provided with the FET Q, combining the BEFs FA and FB with the BEF FC attenuates the unnecessary gain G13 as shown in FIG. 20, while the microwave and millimeter wave amplifier circuit has a larger gain at a wider frequency band, as compared with the prior arts, and provides stable amplification. Further, since no directional coupler is used, the microwave and millimeter wave amplifier circuit can be miniaturized, as compared with the second prior art.

MODIFIED PREFERRED EMBODIMENTS

In the foregoing preferred embodiments, the microwave and millimeter wave amplifier circuits comprise the FET Q, an HEMT. However, the present invention is not limited to this, and the microwave and millimeter wave amplifier circuit may comprise a transistor for high-frequency amplification selected from a wide variety of types of transistors.

In the foregoing preferred embodiments, the source of the FET Q is grounded through a parallel circuit of the two microstrip lines, T3 and T3a. However, the present invention is not limited to this, and the source of the FET Q may be grounded through only one microstrip line T3 or directly grounded via no microstrip line.

Further, although the BEF FA comprises the microstrip line T4, the present invention is not limited to this and the BEF FA need not comprise the microstrip line T4.

Also, although the BEF FB comprises the microstrip line T5, the present invention is not limited to this and permits the BEF FB not to comprise the microstrip line T5.

Further, although the BEF FD comprises the resistor R2, the present invention is not limited to this and permits the BEF FD not to comprise the resistor R2.

Furthermore, although the microwave and millimeter wave amplifier circuit comprises the microstrip lines T6 to T9 for connection, the present invention is not limited to this and permits the amplifier circuit not to comprise the microstrip lines T6 to T9.

In the foregoing preferred embodiments, the capacitors C5 and C6 may be implemented by variable capacitance diodes with a bias voltage applied in such a way that no detection voltage is applied across the variable capacitance diodes.

Although the present invention has been fully described in connection with the preferred embodiments, with reference to the accompanying drawings, various changes and modifications are apparent to those skilled in the art. Such changes and modifications are to be understood as included within the scope of the present invention as defined by the appended claims.

What is claimed is:

1. A microwave and millimeter wave circuit comprising: an amplifier having a center frequency, an input terminal, an output terminal, and a source-grounded transistor having a gate, a drain, and a source;

first and second transmission lines connected between said input terminal and the gate of said transistor, and connected in series to each other, said first and second transmission lines each functioning as an inductor;

third and fourth transmission lines connected between the drain of said transistor and said output terminal, and connected in series to each other, said third and fourth transmission lines each functioning as an inductor;

a first band elimination filter connected to said input terminal said first band elimination filter comprising at least a first capacitor, and having a first stopping frequency;

a second band elimination filter connected to said output terminal said second band elimination filter comprising at least a second capacitor, and having a second stopping frequency;

a third band elimination filter comprising a first parallel circuit composed of a third capacitor and a first series circuit of a fourth capacitor and a first resistor, and comprising a second series circuit of said first parallel circuit and a fifth transmission line functioning as an inductor, said third band elimination filter being connected to a connecting point between the first and second transmission lines and having a third stopping frequency; and a fourth band elimination filter comprising a third parallel circuit composed of a fifth capacitor and a third series circuit of a sixth capacitor and a second resistor, and comprising a fourth series circuit of said third parallel circuit and a sixth transmission line functioning as an inductor, said fourth band elimination filter being connected to a connecting point between said third and fourth transmission lines and having a fourth stopping frequency, wherein each of the first and second stopping frequencies and the third and fourth stopping frequencies is lower than the amplification center frequency, and each of the third and fourth stopping frequencies is higher than the first and second stopping frequencies.

2. The microwave and millimeter wave circuit as claimed in claim 1, wherein said first band elimination filter further comprises a seventh transmission line connected in series with said first capacitor, said seventh transmission line functioning as an inductor, and wherein said second band elimination filter further comprises an eighth transmission line connected in series with said second capacitor, said eighth transmission line functioning as an inductor.

3. A microwave and millimeter wave circuit comprising: an amplifier having a center frequency, an input terminal, an output terminal, and a source-grounded transistor having a gate, a drain, and a source;

first and second transmission lines connected between said input terminal and the gate of said transistor, and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to said input terminal, said first band elimination filter comprising at least a first capacitor and having a first stopping frequency;

a second band elimination filter comprising a first parallel circuit composed of a second capacitor and a first series circuit of a third capacitor and a first resistor, and comprising a second series circuit of said first parallel circuit and a fifth transmission line functioning as an inductor, said second band elimination filter being connected to a connecting point between said first and second transmission lines and having a second stopping frequency; and a third band elimination filter comprising a third parallel circuit composed of a fourth capacitor and a third series circuit of a fifth capacitor and a second resistor, and comprising a fourth series circuit of said third parallel circuit and a sixth transmission line functioning as an inductor, said third band elimination filter being connected to a connecting point between said third and fourth transmission lines and having a third stopping frequency, wherein each of the first stopping frequency and the second and third stopping frequencies is lower than the amplification center frequency, and each of the second and third stopping frequencies is higher than the first stopping frequency.

4. The microwave and millimeter wave circuit as claimed in claim 3, wherein said first band elimination filter further comprises a seventh transmission line connected in series with said first capacitor, said seventh transmission line functioning as an inductor.

5. The microwave and millimeter wave circuit as claimed in claim 3, including an eighth transmission line functioning as an inductor and grounding the source of said transistor.

6. A microwave and millimeter wave circuit comprising: an amplifier having a center frequency, an input terminal, an output terminal, and a source-grounded transistor having a gate, a drain, and a source;

first and second transmission lines connected between said input terminal and the gate of said transistor and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to a connecting point between said first and second transmission lines, said first band elimination filter comprising at least a first capacitor and having a first stopping frequency;

a second band elimination filter connected to a connecting point between said third and fourth transmission lines, said second band elimination filter comprising at least a second capacitor and having a second stopping frequency;

a third band elimination filter comprising a first parallel circuit composed of a third capacitor and a first series circuit of a fourth capacitor and a first resistor, and comprising a second series circuit of said first parallel circuit and a fifth transmission line functioning as an inductor, said third band elimination filter being connected to said input terminal and having a third stopping frequency; and a fourth band elimination filter comprising a third parallel circuit composed of a fifth capacitor and a third series circuit of a sixth capacitor and a second resistor, and comprising a fourth series circuit of said third parallel circuit and a sixth transmission line functioning as an inductor, said fourth band elimination filter being connected to said output terminal and having a fourth stopping frequency, wherein each of the first and second stopping frequencies and the third and fourth stopping frequencies is lower than the amplification center frequency, and each of the third and fourth stopping frequencies is higher than the first and second stopping frequencies.

7. The microwave and millimeter wave circuit as claimed in claim 6, wherein said first band elimination filter further comprises a seventh transmission line connected in series with said first capacitor, said seventh transmission line functioning as an inductor, and wherein said second band elimination filter further comprises an eighth transmission line connected in series with said second capacitor, said eighth transmission line functioning as an inductor.

8. The microwave and millimeter wave circuit as claimed in claim 6, including a ninth transmission line functioning as an inductor and grounding the source of said transistor.

9. A microwave and millimeter wave circuit comprising: an amplifier having a center frequency, an input terminal, an output terminal, and a source-grounded transistor having a gate, a drain, and a source;

first and second transmission lines connected between said input terminal and the gate of said transistor and connected in series to each other, said first and second transmission lines each functioning as an inductor;

third and fourth transmission lines connected between the drain of said transistor and said output terminal and connected in series to each other, said third and fourth transmission lines each functioning as an inductor;

a first band elimination filter connected to a connecting point between said first and second transmission lines, said first band elimination filter comprising at least a first capacitor and having a first stopping frequency;

a second band elimination filter comprising a first parallel circuit composed of a second capacitor and a first series circuit of a third capacitor and a first resistor, and comprising a second series circuit of said first parallel circuit and a fifth transmission line functioning as an inductor, said second band elimination filter being connected to said input terminal and having a second stopping frequency; and a third band elimination filter comprising a third parallel circuit composed of a fourth capacitor and a third series circuit of a fifth capacitor and a second resistor, and comprising a fourth series circuit of said third parallel circuit and a sixth transmission line functioning as an inductor, said third band elimination filter being connected to said output terminal and having a third stopping frequency, wherein each of the first stopping frequency and the second and third stopping frequencies is lower than the amplification center frequency, and each of the second and third stopping frequencies is higher than the first stopping frequency.

10. The microwave and millimeter wave circuit as claimed in claim 9, wherein said first band elimination filter further comprises a seventh transmission line connected in series to said first capacitor, said seventh transmission line functioning as an inductor.

11. The microwave and millimeter wave circuit as claimed in claim 9, including an eighth transmission line functioning as an inductor and grounding the source of said transistor.

12. A microwave and millimeter wave circuit comprising: an amplifier having a center frequency, an input terminal, an output terminal, and a source-grounded transistor having a gate, a drain, and a source;

first and second transmission lines connected between said input terminal and the gate of said transistor and connected in series to each other, said first and second transmission lines each functioning as an inductor;

a third transmission line connected between the drain of said transistor and said output terminal, said third transmission line functioning as an inductor;

a first band elimination filter connected to a connecting point between said first and second transmission lines, said first band elimination filter comprising at least a first capacitor and having a first stopping frequency;

a second band elimination filter connected to said output terminal, said second band elimination filter comprising at least a second capacitor and having a second stopping frequency; and a third band elimination filter comprising a first parallel circuit composed of a third capacitor and a first series circuit of a fourth capacitor and a first resistor, and comprising a second series circuit of said first parallel circuit and a fourth transmission line functioning as an inductor, said third band elimination filter being connected to said input terminal and having a third stopping frequency, wherein each of the first and second stopping frequencies and the third stopping frequency is lower than the amplification center frequency, and the third stopping frequency is higher than the first and second stopping frequencies.

13. The microwave and millimeter wave circuit as claimed in claim 12, wherein said first band elimination filter further comprises a fifth transmission line connected in series with said first capacitor, said fifth transmission line functioning as an inductor, and wherein said second band elimination filter further comprises a sixth transmission line connected in series with said second capacitor, said sixth transmission line functioning as an inductor.

14. The microwave and millimeter wave circuit as claimed in claim 12, including a seventh transmission line functioning as an inductor and grounding the source of said transistor.

\* \* \* \* \*